(12) United States Patent
Tal et al.

(10) Patent No.: US 7,701,997 B2
(45) Date of Patent: Apr. 20, 2010

(54) FAST HOPPING FREQUENCY SYNTHESIZER USING AN ALL DIGITAL PHASED LOCKED LOOP (ADPLL)

(75) Inventors: Nir Tal, Haifa (IL); Robert B. Staszewski, Garland, TX (US); Ofer Friedman, Yehud (IL)

(73) Assignee: Texas Instruments Incorporated, Dallas, TX (US)

( * ) Notice: Subject to any disclaimer, the term of this patent is extended or adjusted under 35 U.S.C. 154(b) by 235 days.

(21) Appl. No.: 11/856,829

(22) Filed: Sep. 18, 2007

(65) Prior Publication Data

US 2008/0043818 A1 Feb. 21, 2008

Related U.S. Application Data

(62) Division of application No. 11/382,570, filed on May 10, 2006, now Pat. No. 7,292,618.

(60) Provisional application No. 60/679,341, filed on May 10, 2005.

(51) Int. Cl.
*H04B 1/69* (2006.01)
*H04B 1/707* (2006.01)
*H04B 1/713* (2006.01)

(52) U.S. Cl. ................... 375/132; 375/135; 375/375; 375/376

(58) Field of Classification Search ............. 375/132, 375/135, 375, 376, 373, 326, 327, 133, 134; 455/76

See application file for complete search history.

(56) References Cited

U.S. PATENT DOCUMENTS

| 5,541,954 | A | * | 7/1996 | Emi | 375/133 |
|---|---|---|---|---|---|
| 5,598,437 | A | * | 1/1997 | Gourse | 375/308 |
| 6,154,640 | A | * | 11/2000 | Itoh et al. | 455/76 |
| 2003/0026353 | A1 | * | 2/2003 | Chen et al. | 375/316 |
| 2003/0063701 | A1 | * | 4/2003 | Eubanks | 375/376 |

* cited by examiner

*Primary Examiner*—Phuong Phu
(74) *Attorney, Agent, or Firm*—Steven A. Shaw; W. James Brady; Frederick J. Telecky, Jr.

(57) ABSTRACT

A novel and useful fast hopping frequency synthesizer and transmitter associated therewith. The frequency synthesizer and transmitter incorporates a digitally controlled oscillator (DCO) adapted to operate open loop. Instantaneous frequency switching is achieved by changing an oscillator tuning word (OTW) to imitate the three oscillators of a UWB transmitter. In one embodiment, the DCO can change the frequency instantaneously within the $1/f_T$ of the varactor devices used to construct the DCO. An all digital phase lock loop (ADPLL) is used for offline calibration prior to the start of packet transmission or reception. Any phase shift during the switching is tracked by a digital circuit in the transmitter. In a second embodiment, additional frequency accuracy is provided by use of a numerically controlled oscillator (NCO) that functions to generate a fine resolution complex exponential waveform which effectively shifts the synthesized frequency. A mixer applies the waveform to the I and Q data samples prior to conversion to the digital domain.

32 Claims, 14 Drawing Sheets

FAST HOPPING FREQUENCY SYNTHESIZER USING AN ALL DIGITAL PHASED LOCKED LOOP (ADPLL)

REFERENCE TO PRIORITY APPLICATION

This application is a divisional of Ser. No. 11/382,570 filed May 10, 2006 which claims priority to U.S. Provisional Application Ser. No. 60/679,341, filed May 10, 2005, entitled "DRP Based MBOA UWB Transmitter", incorporated herein by reference in its entirety.

FIELD OF THE INVENTION

The present invention relates to the field of data communications and more particularly relates to an ultra-wideband (UWB) transmitter incorporating an all-digital phase locked loop (ADPLL) based fast hopping frequency synthesizer.

BACKGROUND OF THE INVENTION

The use of fast hopping frequency synthesizers is well known in the art for applications such as Frequency Hopping Spread Spectrum (FHSS) or Multi Band Orthogonal Frequency Division Multiplexing Ultra Wide Band (MB-OFDM-UWB) transmitters and receivers. As is the case in all transceivers, the synthesized frequency source (i.e. the local oscillator (LO)) is used to both modulate the signal in the transmitter and to demodulate the signal in the receiver.

Local oscillator signals are normally generated using a phase locked loop (PLL) coupled to a crystal oscillator that provides the frequency reference. The loop bandwidth of the PLL determines its settling rate as well as some of the phase noise properties of the generated local oscillator signal. The underlying trade off is that lower loop bandwidths may provide lower phase noise by better rejecting the reference phase noise but at a cost of longer settling times.

FIG. 1 illustrates the basic frequency plan of the WiMedia Physical Layer Specification version 1.1, incorporated herein by reference in its entirety. In accordance with the specification, the usable frequency spectrum of 3 to 11 GHz, generally referenced 10, is divided into five band groups 18, labeled Band Group #1 to Band Group #5. Each band group is further divided into three bands. For example, Band Group #1 is divided into three bands: Band #1 12 centered around 3432 MHz, Band #2 14 centered around 3960 MHz and Band #3 16 centered around 4488 MHz. Each transmission band in all band groups has a bandwidth of 528 MHz.

FIG. 2 illustrates a typical time-frequency allocation for the WiMedia Physical Layer. Each OFDM symbol 32, having a duration of 242 ns, is transmitted followed by a zero padded suffix (ZPS) 34, having a duration of 80 ns, during which zeros are transmitted. The frequency synthesizer in the transmitter and receiver is expected to hop during the hopping duration within the last 9 ns portion 36 of the ZPS.

The OFDM symbols 32 and ZPS durations 34 are transmitted in the various frequency bands at different time intervals according to a pre-determined sequence referred to as a Time Frequency Code (TFC). With reference to FIG. 2, the example time frequency code shown is 1-2-3-1-2-3. The first symbol 20 and its ZPS 26 are transmitted in Band #1, the second symbol 22 and its respective ZPS 28 are transmitted in Band #2 and the third symbol 24 and its corresponding ZPS 30 are transmitted in Band #3. This sequence is repeated throughout the duration of the entire packet.

Note that in this prior art transmission scheme it is imperative that the synthesizer be capable of switching frequencies up to a 1056 MHz hop distance within 9 ns. It is appreciated by one skilled in the art that a single phase locked loop with reasonable phase noise and a settling time of 9 ns is impractical to construct using conventional means.

FIG. 3 illustrates a first prior art synthesizer architecture, generally referenced 40. A crystal 42, coupled to a crystal oscillator 44 generates a reference signal 46 onto which a plurality of phase locked loops (PLLs) are locked. The reference signal 46 frequency is effectively multiplied by the N PLL circuits 48 (i.e. by an integer or rational multiplier) yielding the necessary local oscillator signals simultaneously. The LO signals enter a switch circuit 50 which outputs the required local oscillator signal 52. The switch is operative to choose which signal to place on the local oscillator signal port 52. The switch selects one of the PLL signals in accordance with the hopping sequence 54 generated by the hopping sequence logic 56. The hop sequence is either pre-determined by a standard, negotiated between the receiver and transmitter or generated by a pseudo random sequence, the generating function of which is known a priori to the receiver and transmitter.

A major drawback of this architecture is that for each possible frequency there needs to be a PLL running continuously. This requires a large area (i.e. in either board size or die area) with a consequent large power dissipation. Further, a large enough frequency set may make this scheme impractical to construct.

FIG. 4 illustrates a second prior art synthesizer architecture, generally referenced 60. A crystal 62, coupled to a crystal oscillator 64 generates a reference signal 65 onto which a plurality of phase locked loops (PLLs) are locked. The reference signal 65 frequency is effectively multiplied by the N PLL circuits 66 (i.e. by an integer or rational multiplier) yielding some of the necessary signals and possible signals with frequency differences thereof. A configurable mixer stage 68 effectively mixes (i.e. multiples) some or all of the signals generated by the PLLs 66 to yield the required local oscillator signal 74. Configurable mixer stage 68 can be configured to mix a different set of PLL signals for the various local oscillator signal 74 frequencies required. In some cases mixer techniques such as Single Side Band (SSB) mixers or sub harmonic mixers are used to create the desired effect. The hopping sequence 71 is generated by hopping logic circuit 70. The sequence is either pre-determined by a standard, negotiated between the receiver and transmitter or generated by a pseudo random sequence, the generating function of which is known a priori to the receiver and transmitter.

Although this prior art architecture generally requires a smaller number of PLL circuits than the architecture shown in FIG. 3, the configurable mixer stage usually generates (aside from the desired LO tone) a number of spurious tones which degrade the Spectral Emission Mask (SEM) in the transmitter and pick up (i.e. demodulate into the same frequency band) undesired signals in the receiver.

A third prior art LO architecture, generally referenced 80, constructed in accordance with Mode #1 (i.e. Band Group #1) of the WiMedia 1.1 specification is shown in FIG. 5. A crystal 82, coupled to a crystal oscillator 84 generates a reference signal 104 with a frequency of 44 MHz. The signal is then input to two PLLs, namely PLL1 86 and PLL2 88. Both PLLs use a divide by 2 quadrature topology and generate in-phase (I) and quadrature (Q) LO signals with a 90 degree phase shift between them. PLL1 86 generates an I/Q LO signal pair 90 at a frequency of 3960 MHz. PLL2 88 generates a second I/Q LO signal pair 92 at a frequency of 528 MHz. Note that the frequency difference between the various frequencies in Band Group #1 is an integer multiple of 528 MHz. Therefore, PLL1 86 generates exactly the Band #2 LO, while PLL2 88 generates the frequency difference needed that is mixed with the signal generated by PLL 1 in order to obtain Band #1 and Band #3 LO signals.

The I/Q LO pair 92 is input to a frequency selector block 94 which functions to generate either a +528 MHz tone, a −528 MHz tone or a 0 MHz (DC) tone by inverting the Q signal or setting a DC voltage in both the I/Q pairs, respectively. The frequency selector mode of operation is determined by the hopping sequence 96 generated by the hopping logic 106. The resultant I/Q LO pair 98 enters a single sideband (SSB) mixer circuit 102 along with I/Q LO pair from PLL1 86. The SSB mixer generates the required I/Q LO signal pair 100 at frequencies of either (1) 3432 MHz when a −528 MHz LO is generated by frequency selector 94, (2) 3960 MHz when a DC signal is generated by frequency selector 94 or (3) 4488 MHz LO signal when a +528 MHz LO is generated by frequency selector 94. This architecture, therefore, is capable of generating all three LO signals for Band Group #1. Furthermore, since the frequency selector block operates in an open loop mode, its switching time can meet the required 9 ns period.

A major disadvantage of this architecture is that although the circuit reduces the number of PLL circuits required, with a reduction in area and power count, the SSB mixer 102, along with the desired LO signal, generates a frequency comb at frequencies of 3960 MHz±n528 MHz, where n is an integer. This results in both spurious emissions in neighboring UWB bands in the transmitter and reduced Adjacent Channel Interferer (ACI) performance in the receiver. Note that this UWB architecture follows the general frequency synthesizer architecture of FIG. 4.

A prior art receiver architecture compliant with the WiMedia 1.1 specification is shown in FIGS. 6A and 6B. This synthesizer architecture, generally referenced 110, is a special case of the architecture depicted in FIG. 3. A crystal 146, coupled to a crystal oscillator 148 generates a frequency reference signal 150. The reference signal is input simultaneously to three quadrature PLLs 152, 154, 156, which function to generate LO signals at the three desired frequencies, namely 3432 MHz, 3960 MHz and 4488 MHz, respectively. The I/Q signals for the three LOs 158, 160, 162, respectively represent a pair of 90 degree phase shifted signals for each LO.

The synthesizer architecture 110 is coupled to the receiver architecture, generally referenced 125. The RF signal is picked up by an antenna 112 and amplified by a low noise amplifier LNA 114. The amplified LNA signal 116 is simultaneously input to three down conversion circuits (i.e. quadrature mixers) 118, 120, 124. Each one of the three quadrature mixers is controlled by a respective activation signal which is operative to switch the circuit off, effectively generating a zero output. The three activation signals 166 are generated by the hopping logic 164. Each of the three I/Q mixer pairs 118, 120, 124 uses the corresponding I/Q LO pair 158, 160, 162, respectively. The resultant I/Q baseband signals 122, 123, 126, respectively, are summed separately for the in-band baseband signal (via summing circuit 136) and the quadrature baseband signal (via summing circuit 128). The I/Q baseband signals 138 and 139 are filtered by low pass filters 140 and 141, respectively, to yield the filtered I/Q baseband (BB) signals 142 and 143, respectively. These signals are then sampled and processed by the digital receiver (not shown).

Although this receiver architecture does not suffer from the spurious tone effects as does the architecture of FIG. 5, it does require three PLL circuits and three down conversion mixer pairs creating a significant size and power dissipation penalty.

Thus, there is a need for a fast hopping frequency synthesizer scheme that meets the requirements of the WiMedia specification. The scheme should be capable of providing the three required frequencies without generating excessive frequency spurs, should exhibit a quiet spectrum at LO frequencies, and should minimize both power consumption and silicon real estate.

SUMMARY OF THE INVENTION

The present invention provides a solution to the problems of the prior art by providing a novel and useful fast hopping frequency synthesizer and associated transmitter, receiver and transceiver. Several embodiments of the frequency synthesizer, transmitter and transceiver are described wherein each comprises a digitally controlled oscillator (DCO) that is adapted to run open loop. In addition, an open loop/closed loop hybrid embodiment is presented. In each embodiment, the instantaneous frequency switching is achieved by changing an oscillator tuning word (OTW) to imitate the three oscillators of a UWB transmitter.

In one embodiment, the DCO can change the frequency instantaneously within the $1/f_T$ of the varactor devices used to construct the DCO. An all digital phase lock loop (ADPLL) is used for offline calibration prior to the start of packet transmission or reception. Any phase shift during the switching is tracked by a digital circuit in the transmitter.

In a second embodiment, additional frequency accuracy is provided by use of a numerically controlled oscillator (NCO) that functions to generate a fine resolution complex exponential waveform which effectively shifts the synthesized frequency. A mixer applies the waveform to the I and Q data samples prior to conversion to the digital domain.

A key feature of the present invention is that unlike the prior art, a single DCO is used to implement a UWB compliant transmitter that meets the UWB specifications of avoiding excessive frequency spurs outside the bands of interest. Use of DCO controlled by an ADPLL by the frequency synthesizer of the present invention eliminates the need for both simultaneous generation of all local oscillator (LO) signals as well as modulation of multiple synthesizers.

Several advantages of the present invention include (1) only a single DCO is required which operates in an open-loop mode, (2) the resulting spectrum is very quiet at the LO frequencies (i.e. free of spurs), (3) exhibits very low power consumption, (4) requires a significantly smaller size IC area, and (5) provides a self-calibration process that selects accurate OTWs thus insuring FCC and UWB specifications are met.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a frequency synthesizer comprising a table adapted to store a plurality of oscillator tuning words (OTW), an all digital phase locked loop (ADPLL) comprising a digitally controlled oscillator (DCO) coupled to the table, the DCO operative to generate an output signal whose frequency is determined in accordance with the OTW, a feedback circuit coupled to the output of the DCO, the feedback circuit operative to calibrate the frequency output of the DCO and calibration means coupled to the table and the feedback circuit, the calibration means operative to configure open and closed modes of operation of the frequency synthesizer.

There is also provided in accordance with the invention, a frequency hopping transmitter comprising a digital modulator operative to generate data samples, a fast hopping frequency synthesizer comprising a table adapted to store a plurality of oscillator tuning words (OTW), an all digital phase locked loop (ADPLL) comprising a digitally controlled oscillator (DCO) coupled to the table, the DCO operative to generate local oscillator (LO) signals whose frequency is determined in accordance with the OTW, a feedback circuit coupled to the output of the DCO, the feedback circuit operative to calibrate the frequency output of the DCO, hopping means operative to generate a frequency hopping control sequence input to the table, calibration means coupled to the table and the feedback circuit, the calibration means operative to configure open and closed modes of operation of the frequency synthesizer and a mixer operative to mix data signals with the LO signals yielding an RF waveform signal therefrom.

There is further provided in accordance with the invention, a frequency synthesizer comprising a table adapted to store a plurality of oscillator tuning words (OTW) means for splitting the OTW into an integer portion and a fractional portion, an all digital phase locked loop (ADPLL) comprising a digitally controlled oscillator (DCO) coupled to the table, the DCO operative to generate local oscillator (LO) signals whose frequency is determined in accordance with the integer portion of the OTW, a feedback circuit coupled to the output of the DCO, the feedback circuit operative to calibrate the frequency output of the DCO and calibration means coupled to the table and the feedback circuit, the calibration means operative to configure open and closed modes of operation of the frequency synthesizer.

There is also provided in accordance with the invention, a frequency hopping transmitter comprising a digital modulator operative to generate I and Q data samples, a fast hopping frequency synthesizer comprising a table adapted to store a plurality of oscillator tuning words (OTW), means for splitting the OTW into an integer portion and a fractional portion, an all digital phase locked loop (ADPLL) comprising a digitally controlled oscillator (DCO) coupled to the table, the DCO operative to generate in phase and quadrature local oscillator (LO) signals whose frequency is determined in accordance with the integer portion of the OTW, a feedback circuit coupled to the output of the DCO, the feedback circuit operative to calibrate the frequency output of the DCO, hopping means operative to generate a frequency hopping control sequence input to the table, calibration means coupled to the table and the feedback circuit, the calibration means operative to configure open and closed modes of operation of the frequency synthesizer, frequency correction means for generating and applying a frequency correction signal to the I samples and the Q samples in accordance with the fractional portion of the OTW, a mixer operative to mix frequency corrected I data samples with the in phase LO signal and to mix frequency corrected Q data samples with the quadrature LO signal to generate an RF waveform signal therefrom and a power amplifier coupled to the mixer, the power amplifier operative to amplify the RF waveform signal to yield an output RF signal therefrom.

There is further provided in accordance with the invention, a frequency hopping receiver comprising a low noise amplifier (LNA) coupled to an antenna, the LNA adapted to generate an amplified receive signal, a fast hopping frequency synthesizer comprising a table adapted to store a plurality of oscillator tuning words (OTW), an all digital phase locked loop (ADPLL) comprising a digitally controlled oscillator (DCO) coupled to the table, the DCO operative to generate local oscillator (LO) signals whose frequency is determined in accordance with the OTW, a feedback circuit coupled to the output of the DCO, the feedback circuit operative to calibrate the frequency output of the DCO, hopping means operative to generate a frequency hopping control sequence input to the table, calibration means coupled to the table and the feedback circuit, the calibration means operative to configure open and closed modes of operation of the frequency synthesizer, a quadrature mixer operative to mix the receive signal with the local oscillator signals to yield analog baseband signals therefrom, analog to digital converter means operative to convert the analog baseband signals to a baseband sample stream and a digital demodulator operative to generate receive data from the baseband sample stream.

There is also provided in accordance with the invention, a frequency hopping transceiver comprising a fast hopping local oscillator (LO) synthesizer comprising a table adapted to store a plurality of oscillator tuning words (OTW), an all digital phase locked loop (ADPLL) comprising a digitally controlled oscillator (DCO) coupled to the table, the DCO operative to generate local oscillator (LO) signals whose frequency is determined in accordance with the OTW, a feedback circuit coupled to the output of the DCO, the feedback circuit operative to calibrate the frequency output of the DCO, hopping means operative to generate a frequency hopping control sequence input to the table, calibration means coupled to the table and the feedback circuit, the calibration means operative to configure open and closed modes of operation of the LO synthesizer, a transmitter operative to modulate and upconvert an input data stream utilizing the LO signals to generate an output RF signal therefrom and a receiver operative to downconvert and demodulate a signal received from an antenna utilizing the LO signals to generate an output data stream therefrom.

There is further provided in accordance with the invention, a frequency hopping receiver comprising a low noise amplifier (LNA) coupled to an antenna, the LNA adapted to generate an amplified receive signal, a fast hopping frequency synthesizer comprising a table adapted to store a plurality of oscillator tuning words (OTW), means for splitting the OTW into an integer portion and a fractional portion, an all digital phase locked loop (ADPLL) comprising a digitally controlled oscillator (DCO) coupled to the table, the DCO operative to generate in phase and quadrature local oscillator (LO) signals whose frequency is determined in accordance with the integer portion of the OTW, a feedback circuit coupled to the output of the DCO, the feedback circuit operative to calibrate the frequency output of the DCO, hopping means operative to generate a frequency hopping control sequence input to the table, calibration means coupled to the table and the feedback circuit, the calibration means operative to configure open and closed modes of operation of the frequency synthesizer, a quadrature mixer operative to mix the receive signal with the local oscillator signals to yield analog baseband signals therefrom, analog to digital converter means operative to convert the analog baseband signals to a baseband sample stream and frequency correction means for generating and applying a frequency correction signal to the baseband sample stream in accordance with the fractional portion of the OTW and a digital demodulator operative to generate receive data from the baseband sample stream.

There is also provided in accordance with the invention, a frequency hopping transceiver comprising a fast hopping frequency synthesizer comprising a table adapted to store a plurality of oscillator tuning words (OTW), means for splitting the OTW into an integer portion and a fractional portion, an all digital phase locked loop (ADPLL) comprising a digitally controlled oscillator (DCO) coupled to the table, the DCO operative to generate in phase and quadrature local oscillator (LO) signals whose frequency is determined in accordance with the integer portion of the OTW, a feedback circuit coupled to the output of the DCO, the feedback circuit operative to calibrate the frequency output of the DCO, hopping means operative to generate a frequency hopping control sequence input to the table, calibration means coupled to the table and the feedback circuit, the calibration means operative to configure open and closed modes of operation of the frequency synthesizer, a transmitter operative to modulate and upconvert an input data stream utilizing the LO signals to generate an output RF signal therefrom, a receiver operative to downconvert and demodulate a signal received from an antenna utilizing the LO signals to generate an output data stream therefrom and frequency correction means for generating and applying a frequency correction signal to the transmitter and the receiver in accordance with the fractional portion of the OTW.

There is further provided in accordance with the invention, a fast hopping frequency synthesizer comprising a digitally controlled oscillator (DCO), the DCO operative to generate an output signal, a feedback circuit coupled to the output of the DCO, the feedback circuit operative to track a phase of the DCO and a controller coupled to the feedback circuit and the DCO, the controller operative to configure the DCO to operate open loop during packets.

There is also provided in accordance with the invention, a method of fast hopping frequency synthesis, the method comprising the steps of generating an output frequency during a packet based on an oscillator tuning word (OTW), monitoring a phase drift during the packet and calculating a new value for the OTW in response to the phase drift.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
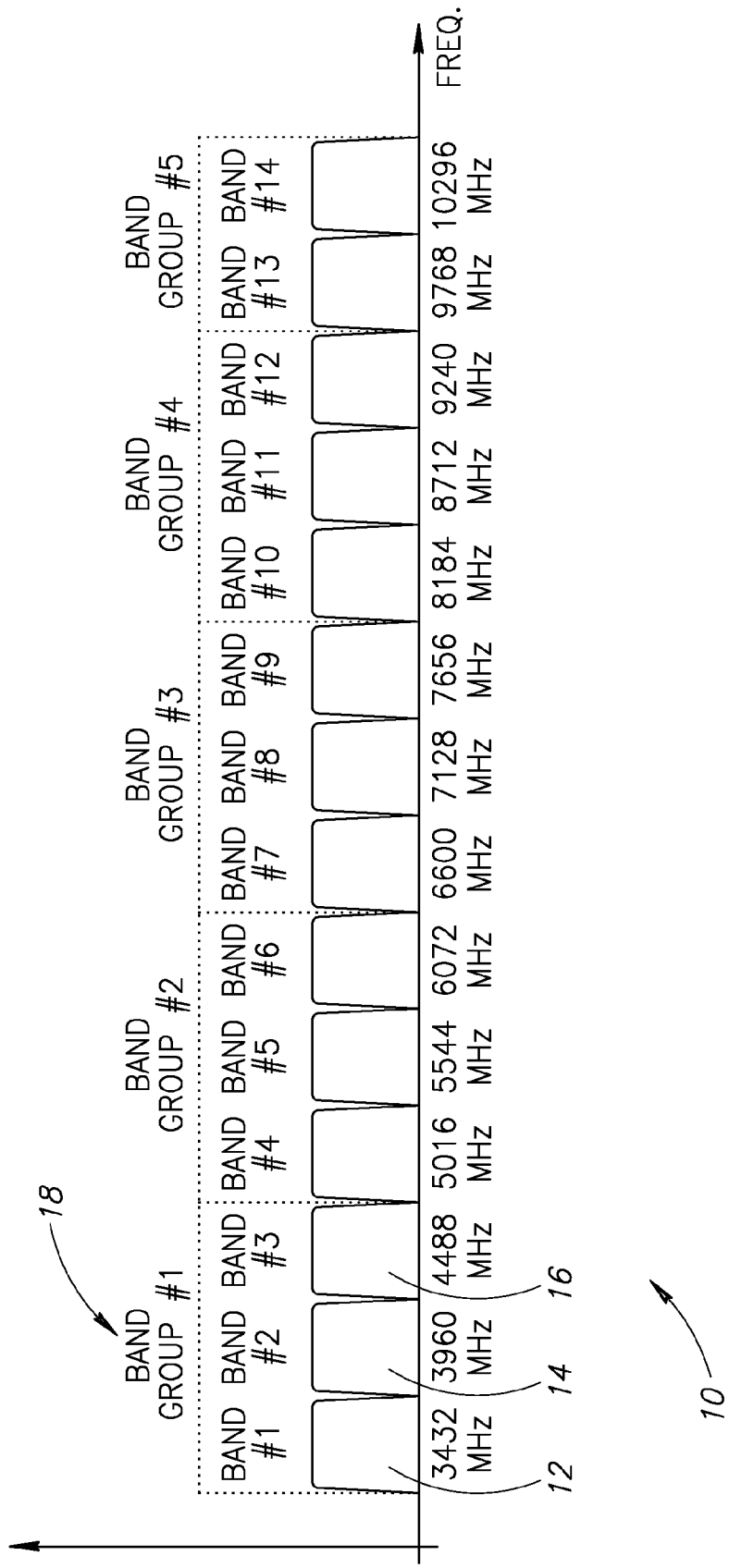
FIG. 1 is a diagram illustrating the basic frequency band allocation plan of the WiMedia Physical Layer Specification.
Figure 2:
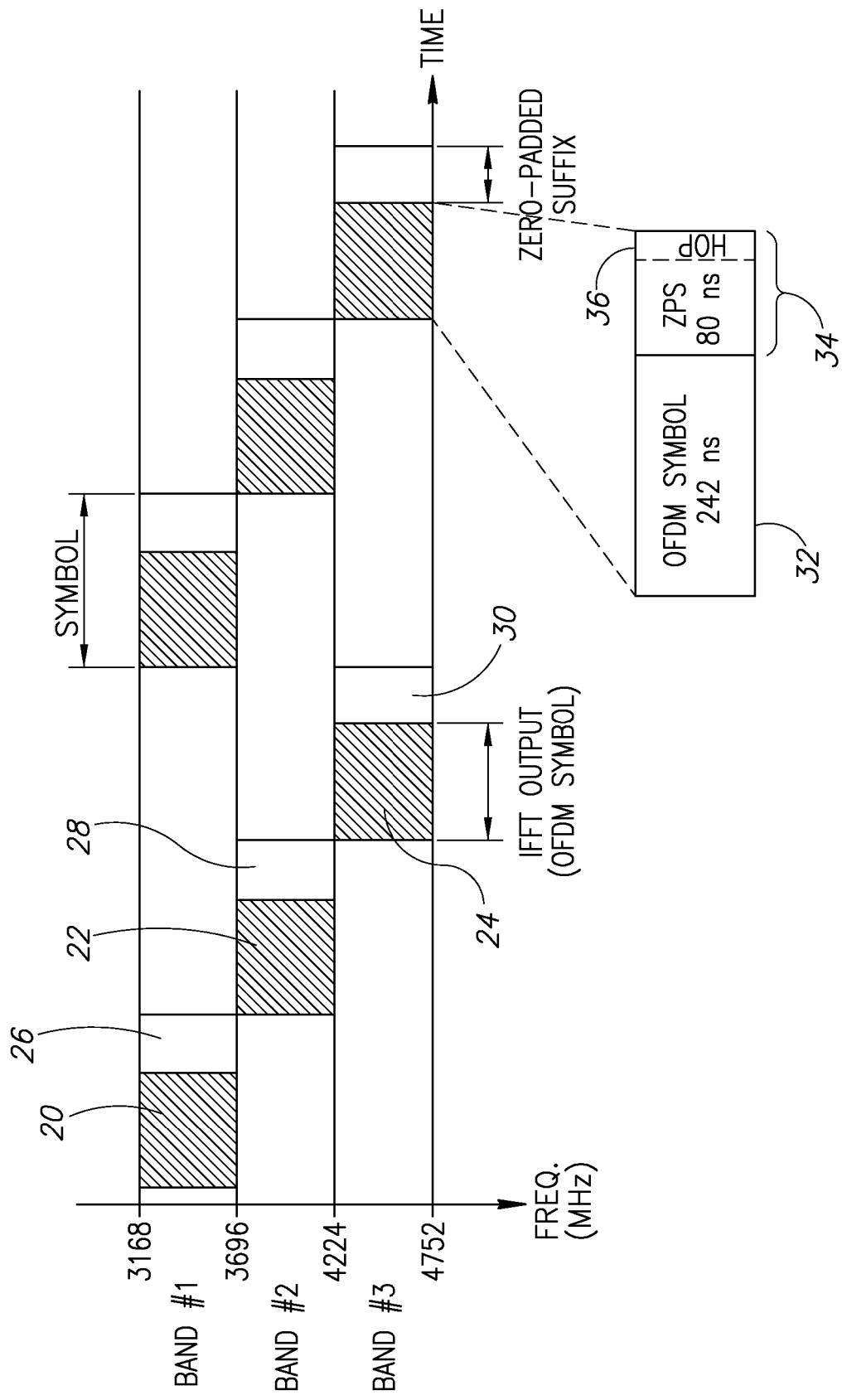
FIG. 2 is a diagram illustrating a typical time-frequency spectral allocation for the WiMedia Physical Layer Specification.
Figure 3:
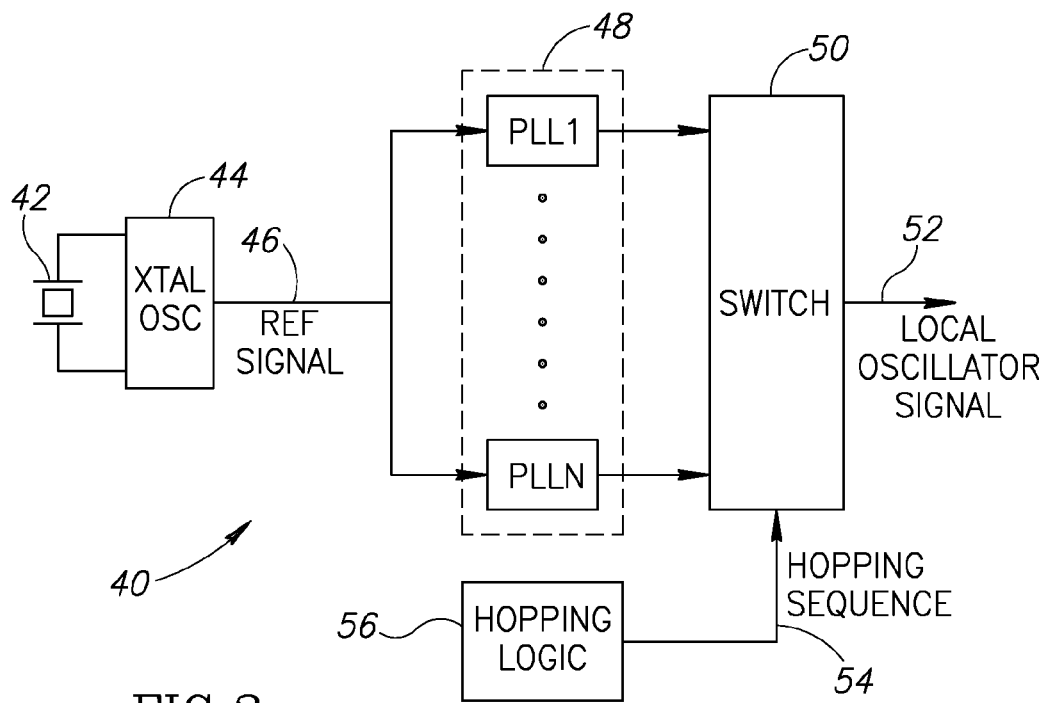
FIG. 3 is a block diagram illustrating a first prior art fast hopping synthesizer architecture employing a plurality of simultaneous PLLs and a selector switch.
Figure 4:
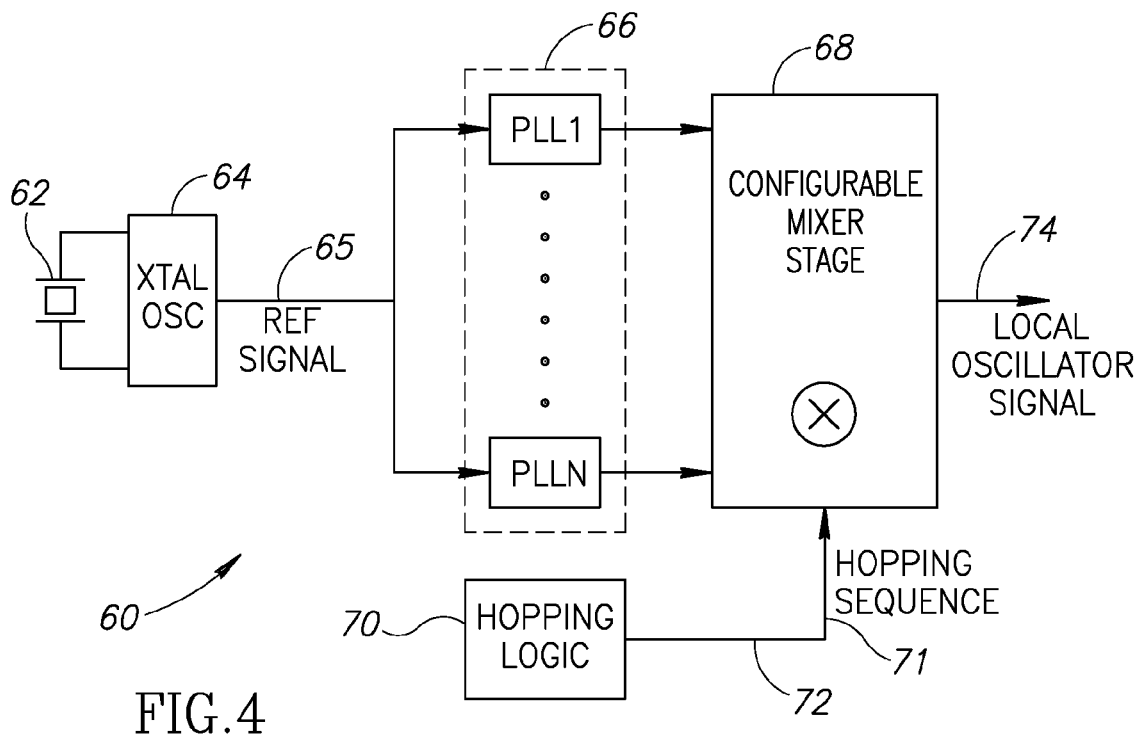
FIG. 4 is a block diagram illustrating a second prior art fast hopping synthesizer architecture employing a plurality of PLLs and a configurable mixer stage.
Figure 5:
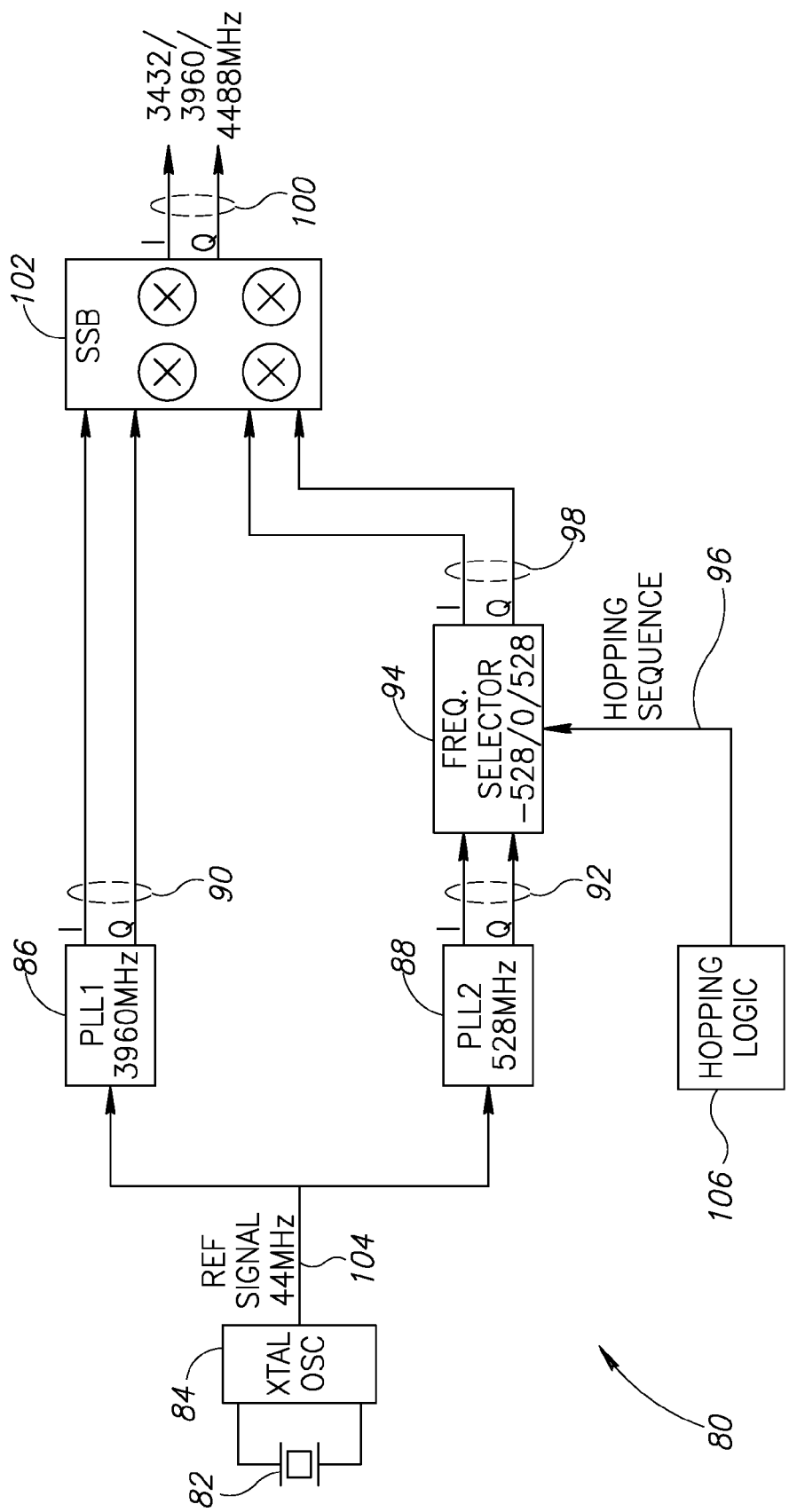
FIG. 5 is a block diagram illustrating a prior art frequency source for the UWB WiMedia specification.
Figure 6A:
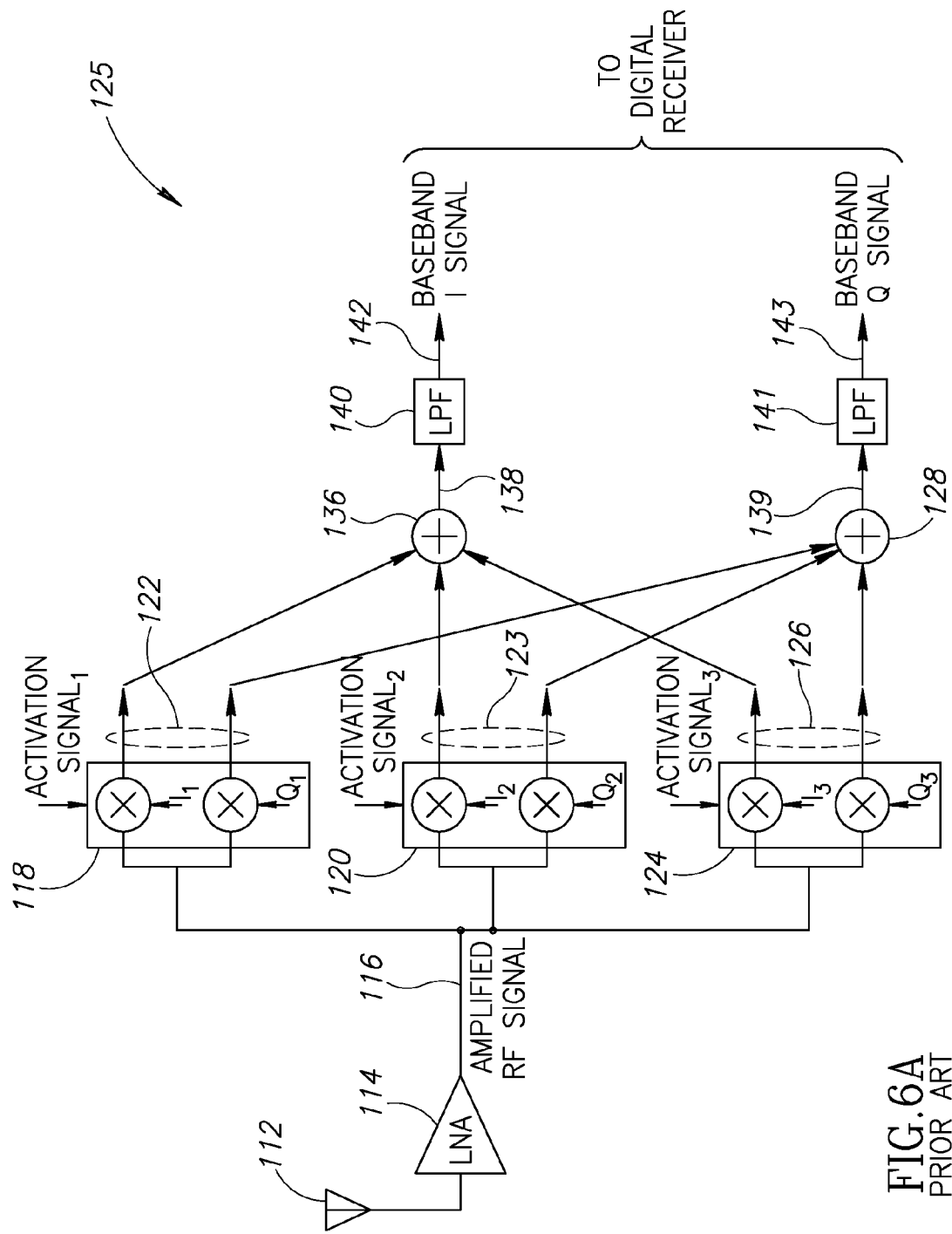
FIGS. 6A and 6B are block diagrams illustrating a prior art receiver architecture for the UWB WiMedia Specification.
Figure 6B:
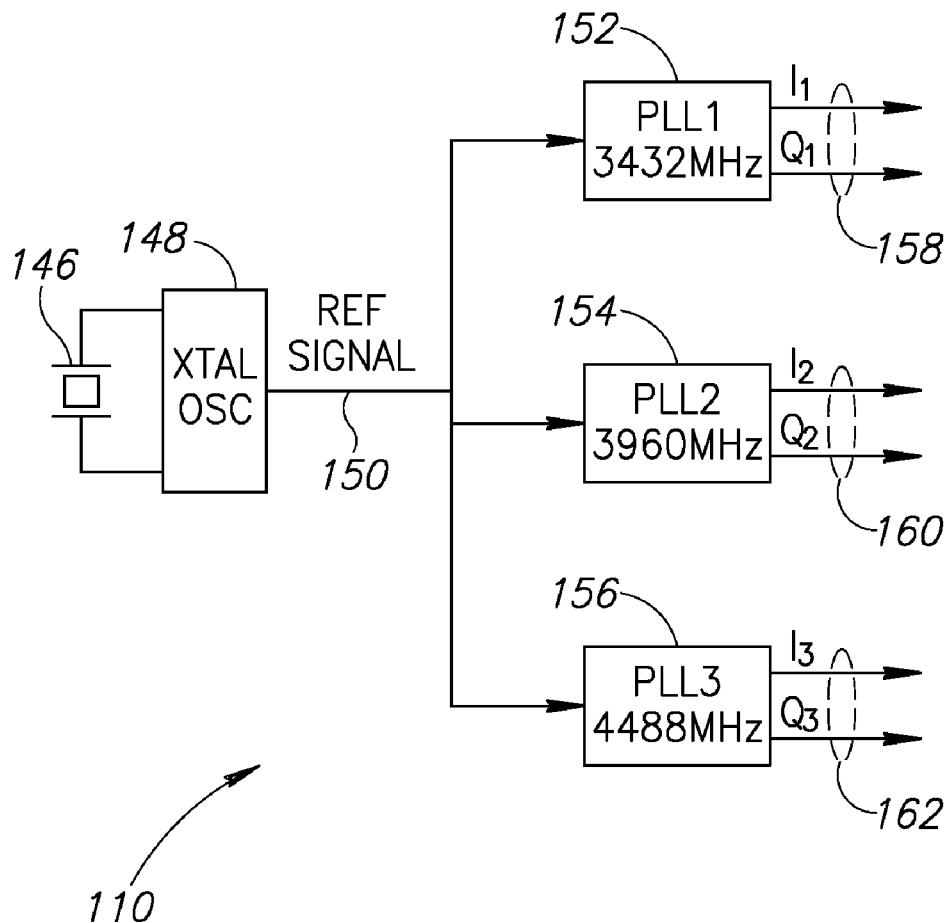
Figure 6B:
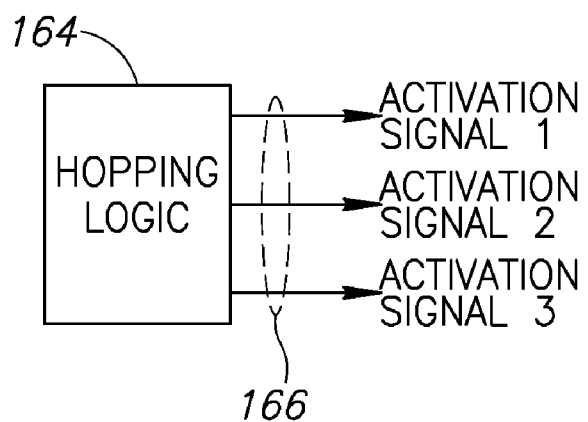

The following notation is used throughout this document.

| Term | Definition |
| --- | --- |
| ACI | Adjacent Channel Interferer |
| ADC | Analog to Digital Converter |
| ADPLL | All Digital Phase Locked Loop |
| ASIC | Application Specific Integrated Circuit |
| BB | Baseband |
| CL | Closed Loop |
| DAC | Digital to Analog Converter |
| DCO | Digitally Controlled Oscillator |
| DRP | Digital RF Processor or Digital Radio Processor |
| DSP | Digital Signal Processor |
| EDGE | Enhanced Data rates for Global Evolution |
| FCW | Frequency Command Word |
| FHSS | Frequency Hopping Spread Spectrum |
| FPGA | Field Programmable Gate Array |
| FSK | Frequency Shift Keying |
| HDL | Hardware Description Language |
| LO | Local Oscillator |
| MBOA | Multiband OFDM Alliance |
| MLSR | Maximal Length Shift Register |
| NCO | Numerically Controlled Oscillator |
| OFDM | Orthogonal Frequency Division Multiplexing |
| OL | Open Loop |
| OTW | Oscillator Tuning Word |
| PA | Power Amplifier |
| PLL | Phase Locked Loop |
| PN | Pseudo-noise |
| QAM | Quadrature Amplitude Modulation |
| RAM | Random Access Memory |
| RF | Radio Frequency |
| SEM | Spectral Emission Mask |
| SSB | Single Side Band |
| TDD | Time Division Duplex |

-continued

| Term | Definition |
|---|---|
| TFC | Time Frequency Code |
| UWB | Ultra Wideband |
| WCDMA | Wideband Code Division Multiple Access |
| WLAN | Wireless Local Area Network |
| ZPS | Zero Padded Suffix |

DETAILED DESCRIPTION OF THE INVENTION

The present invention provides a solution to the problems of the prior art by providing a novel and useful fast hopping frequency synthesizer and associated transmitter. Several embodiments of the frequency synthesizer and transmitter are described wherein each comprises a digitally controlled oscillator (DCO) that is adapted to run open loop during the OFDM symbols or very short packets.

In both embodiments, the DCO can change the frequency instantaneously within the $1/f_T$ of the varactor devices (circa 100 GHz in the most advanced CMOS processes) used to construct the DCO. An all digital phase lock loop (ADPLL) feedback circuit is used for factory calibration or offline calibration prior to the start of packet transmission or reception. The ADPLL could also be used to track the DCO phase during the OFDM symbols or very short packets. Any phase shift during the switching is tracked by a digital circuit in the transmitter.

In a second embodiment, additional frequency accuracy is provided by use of a numerically controlled oscillator (NCO) that functions to generate a fine resolution complex exponential waveform which effectively shifts the synthesized frequency. A mixer applies the waveform to the I and Q data samples prior to conversion to the digital domain.

The fast hopping frequency synthesizer of the present invention is intended for use in a radio transmitter and transceiver but can be used in other applications as well. In an example application of the present invention, frequency switching is achieved by changing the oscillator tuning word (OTW) to imitate the three oscillators of a Multiband OFDM Alliance (MBOA) UWB transmitter. It is appreciated by one skilled in the art that the frequency synthesizer of the present invention is not limited for use with any particular communication standard (wireless or otherwise) can be adapted for use with numerous wireless (or wired) communications standards such as EDGE, extended data rate Bluetooth, WCDMA, Wireless LAN (WLAN), Ultra Wideband (UWB), OFDM, coaxial cable, radar, optical, etc. Further, the invention is not limited for use with a specific modulation scheme but is applicable to other complex modulation schemes as well.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, telephonic, etc. In the case of wireless communications, the communications device may comprise an RF transmitter, RF receiver, RF transceiver or any combination thereof.

To better illustrate the operation and utility of the synthesizer system of the present invention, the synthesizer is described in the context of a general fast hopping transmitter with an example in the framework of an MB-OFDM-UWB receiver and transmitter. However, it is understood that the example presented throughout this disclosure in no way limits the scope of the present invention. One skilled in the art may apply this architecture to many other types of communication systems, those of which are well known in the art.

The fast hopping frequency synthesizer circuit architecture can be used in a UWB compliant transmitter that incorporates an ADPLL within a digital radio processor. The description of the frequency synthesizer and related transmitter is provided in the context of an all digital PLL (ADPLL) based RF transmitter. An ADPLL suitable for use in the present invention is described in more detail in U.S. Pat. Nos. 6,791,422 and 6,809,598 and U.S. application Ser. No. 11/203,019, filed Aug. 11, 2005, entitled "Hybrid Polar/Cartesian Digital Modulator," all of which are incorporated herein by reference in their entirety.

First Embodiment Direct Conversion Transmitter

Figure 7:
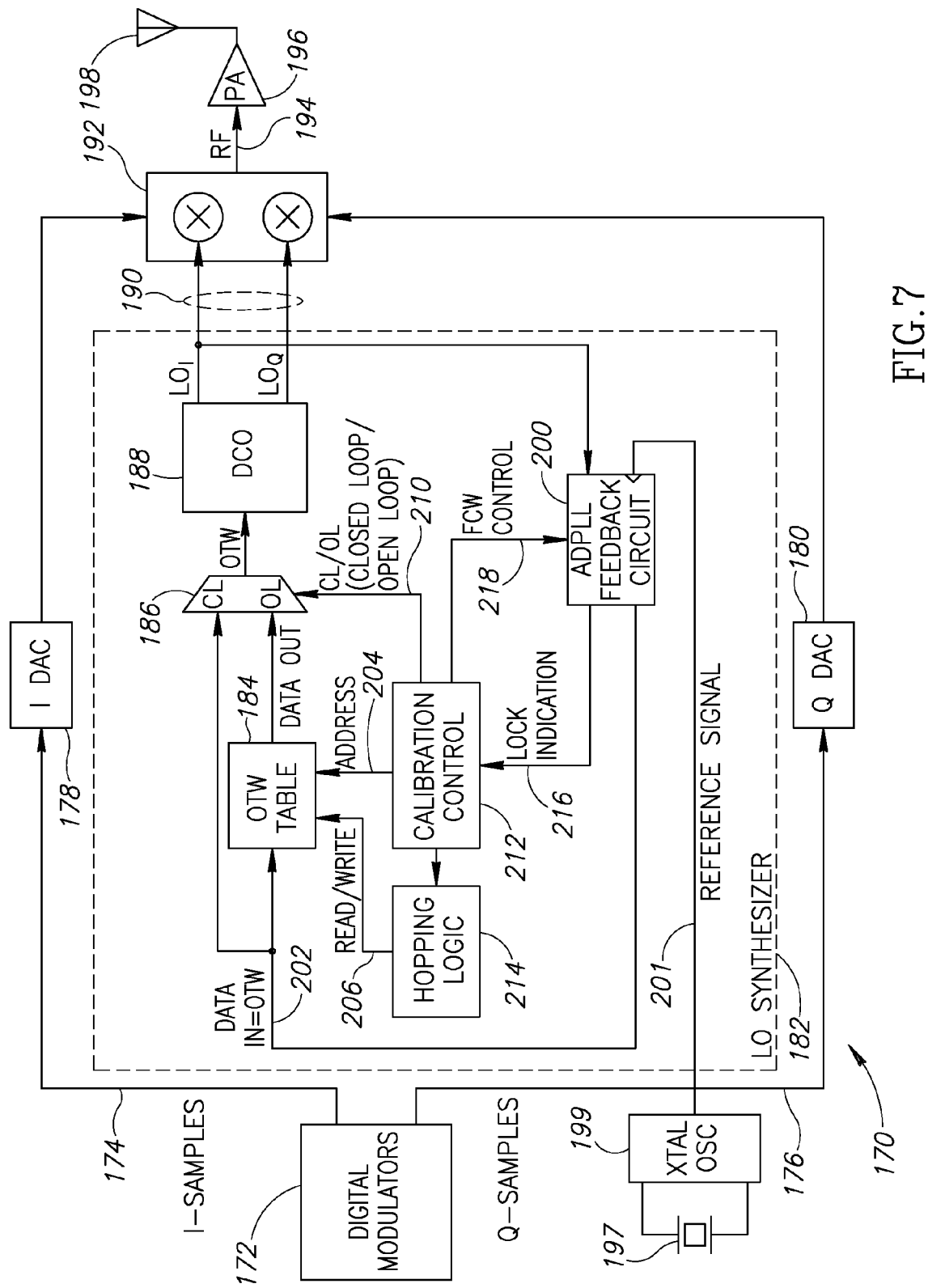
FIG. 7 is a block diagram illustrating a high-level direct conversion transmitter constructed in accordance with a first embodiment of the present invention.

A block diagram illustrating a high-level direct conversion transmitter constructed in accordance with a first embodiment of the present invention is shown in FIG. 7. A crystal oscillator 199, coupled to a crystal 197 generates a reference signal 201. The transmitter circuit, generally referenced 170, comprises a digital modulator 172, I DAC 178, Q DAC 180, LO frequency synthesizer 182, I/Q mixer 192, power amplifier (PA) 196 and antenna 198. The frequency synthesizer 182 comprises a Digitally Controlled Oscillator (DCO) 188 coupled through an All Digital Phase Locked Loop (ADPLL) feedback circuit 200, hopping logic 214, calibration control 212, oscillator tuning word (OTW) table 184 and multiplexer 186 for opening the loop. Timing for the ADPLL feedback circuit is provided by the reference signal 201 output from the crystal oscillator 199 coupled to crystal 197. To prevent and frequency perturbations, the OTW input to the DCO is required to be changed glitchlessly and the effect of the OTW level changes should be substantially time aligned. Note that throughout this document, the ADPLL block comprises the entire phase locked loop excluding the DCO (i.e. the feedback path only), which is shown explicitly.

The OTW table comprises RAM or other memory means which functions to store the pre-calibrated oscillator tuning words (OTW) 202 of all required synthesized frequencies. The calibration control 212 is operative to generate the signals for the other modules in the frequency synthesizer for either calibrating the circuit or initializing the fast hopping sequence. The hopping logic 214 is operative to generate the required hopping sequence.

For further reference, the frequency synthesizer generates a hopping sequence S[n] during the $n^{th}$ hopping duration, where S[n] is the index of the frequency to be transmitted from a finite frequency alphabet $\{F_i, i=0 \ldots N-1\}$ of size N. Therefore, the frequency synthesized during the $n^{th}$ hopping duration shall be $F_{S[n]}$. The synthesizer can thus generate N frequencies.

The digital modulator 172 functions to generate in phase samples 174 and quadrature samples 176. Two digital to analog converters (DAC) convert the I and Q samples to analog wave forms. The I DAC 178 functions to convert the I samples 174 and the Q DAC 180 functions to convert the Q samples 176. A quadrature single sideband (SSB) mixer 192 operates on the baseband analog voltages and the generated I and Q LO signals 190 to generate an RF waveform 194. The RF signal is output to the power amplifier (PA) 196 and subsequently to antenna 198 for wireless transmission. Note that the I and Q modulation performed by the transmitter 170 can be implemented using digital techniques as described in U.S. application Ser. No. 10/927,879, filed Aug. 27, 2004, entitled "Digital Amplitude Modulation," U.S. application Ser. No. 11/203,504, filed Aug. 11, 2005, entitled "Method And Apparatus For A Fully Digital Quadrature Modulator," and U.S. application Ser. No. 11/297,524, filed Dec. 7, 2005, entitled "Digital Transmitter Incorporating Spectral Emission Shaping Sigma Delta Modulator," all of which are incorporated herein by reference in their entirety. Alternatively, the I and Q modulation can be converted into a polar modulation and implemented using digital techniques as described in U.S. application Ser. No. 11/203,019, entitled "Hybrid Polar/Cartesian Digital Modulator" cited supra.

The synthesizer works in one of the following three modes: calibration, initialization and operation. Each mode is described in more detail infra with reference to FIGS. 8, 9 and 10.

Calibration

Figure 8:
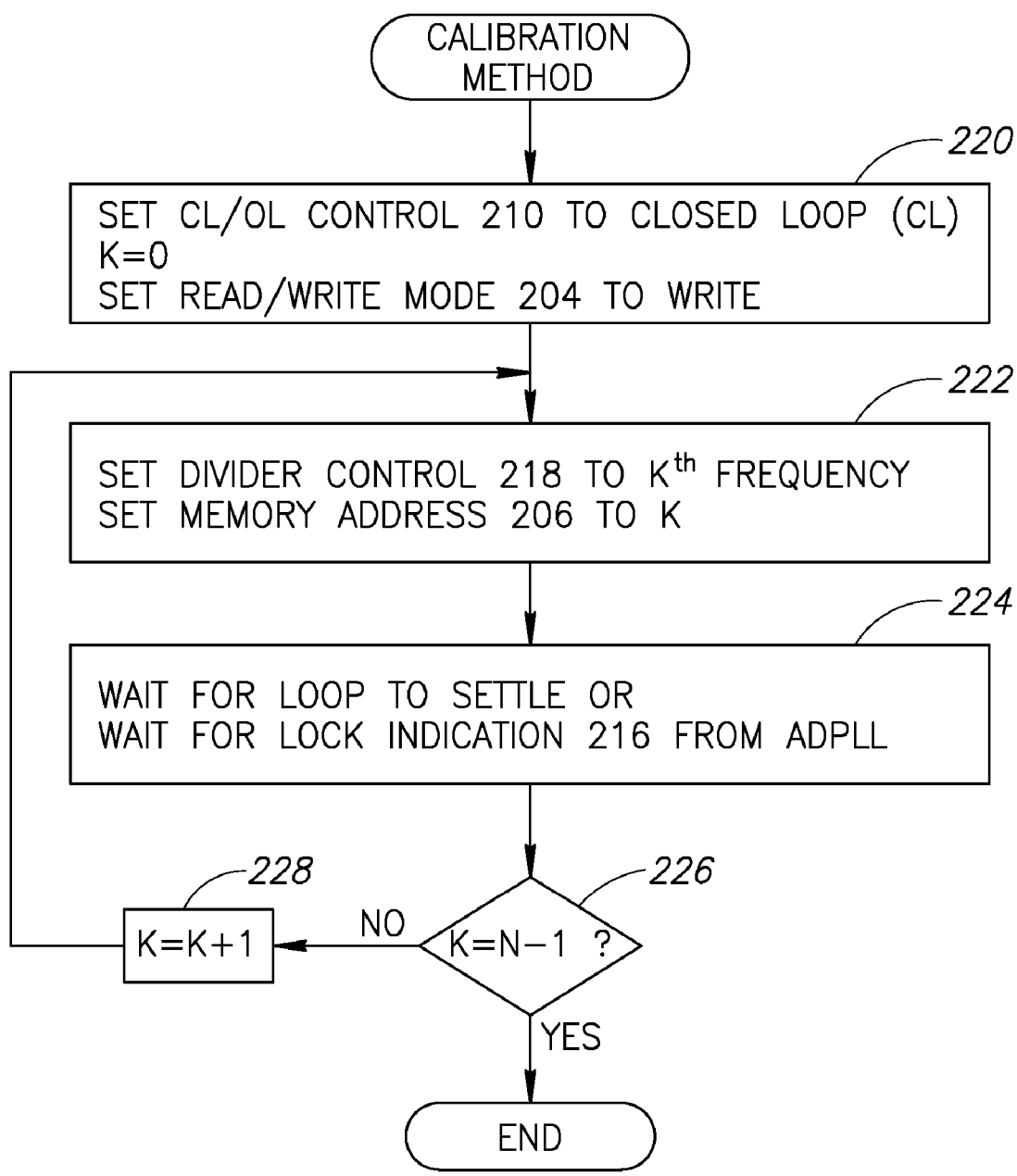
FIG. 8 is a flow diagram illustrating the calibration sequence method of the first embodiment of the present invention.

A flow diagram illustrating the calibration sequence method of the first embodiment of the present invention is shown in FIG. 8. The calibration method is first run in the factory, then engaged periodically or prior to a packet transmission. With reference to both FIGS. 7 and 8, the calibration control circuit 212 performs the calibration sequence method shown in the figure. The calibration sequence starts by (1) setting the multiplexer 186 to the closed loop mode by setting the CL/OL mux control signal 210 to CL, (2) setting the variable K=0 and (3) setting the read/write control line 204 to OTW table 184 to "WRITE" (step 220). The calibration control circuit then (1) configures the frequency command word (FCW) 218 of the ADPLL 200 such that the closed loop will generate the $F_K$ frequency and (2) sets the memory address control 206 of the OTW table to K (step 222). The loop is now closed and the ADPLL circuit settles such that the DCO block 188 generates the I and Q LO signals 190 with frequency $F_K$. In the example circuit presented, the settling time is on the order of microseconds or tens of microseconds, thus not sufficient to meet the approximately 9 ns WiMedia requirement.

The calibration sequence then either waits a predetermined time or waits for a lock indication signal 216 from the ADPLL indicating that the loop has settled to within a desired frequency error (step 224). The calibration control circuit then checks whether there are additional frequencies to calibrate by checking whether variable K is equal to the number of desired frequencies N−1 (step 226). If there are no additional frequencies to calibrate, the calibration sequence ends. Otherwise, the variable K is incremented (step 228) and the method continues with step 222. In this manner, the calibration control module scans through all the desired frequencies $F_0$ through $F_{N-1}$, thus generating a table of the required OTWs in the OTW table.

Initialization

Figure 9:
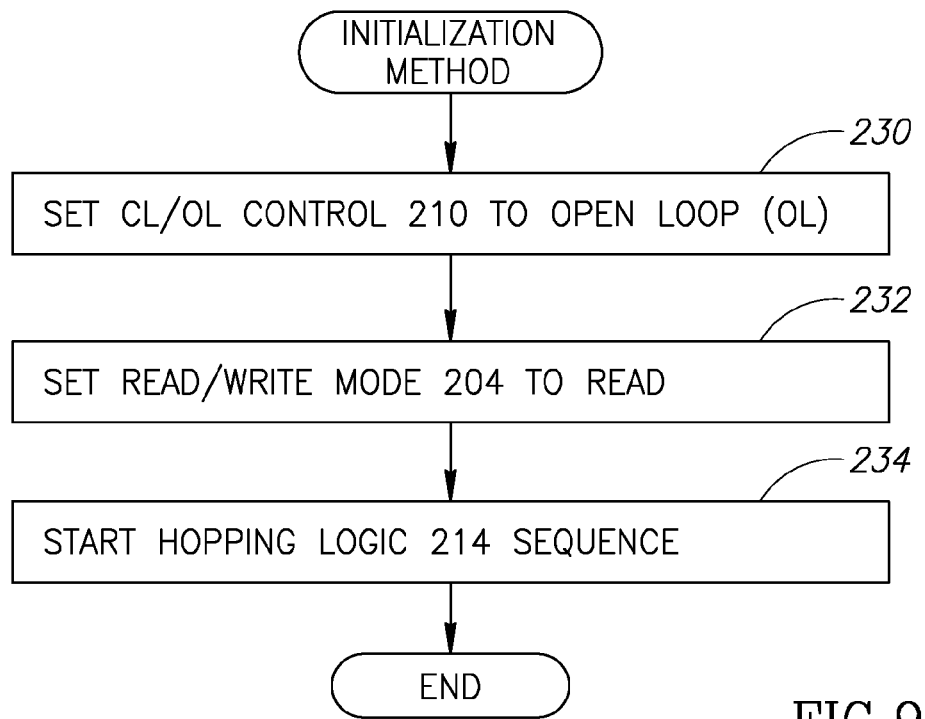
FIG. 9 is a flow diagram illustrating the initialization sequence method of the first embodiment of the present invention.

A flow diagram illustrating the initialization sequence method of the first embodiment of the present invention is shown in FIG. 9. In the initialization mode, an initialization sequence is executed by the calibration control circuit 212. The initialization sequence starts by setting the CL/OL mux control signal 210 to the multiplexer block 186 to OL, i.e. open loop (step 230) thus opening the frequency synthesis loop. The calibration control circuit then sets the read/write control line 204 to the OTW table to "READ" (step 232). Finally calibration control circuit starts to generate the hopping sequence via the hopping logic 214 (step 234).

Operation

Figure 10:
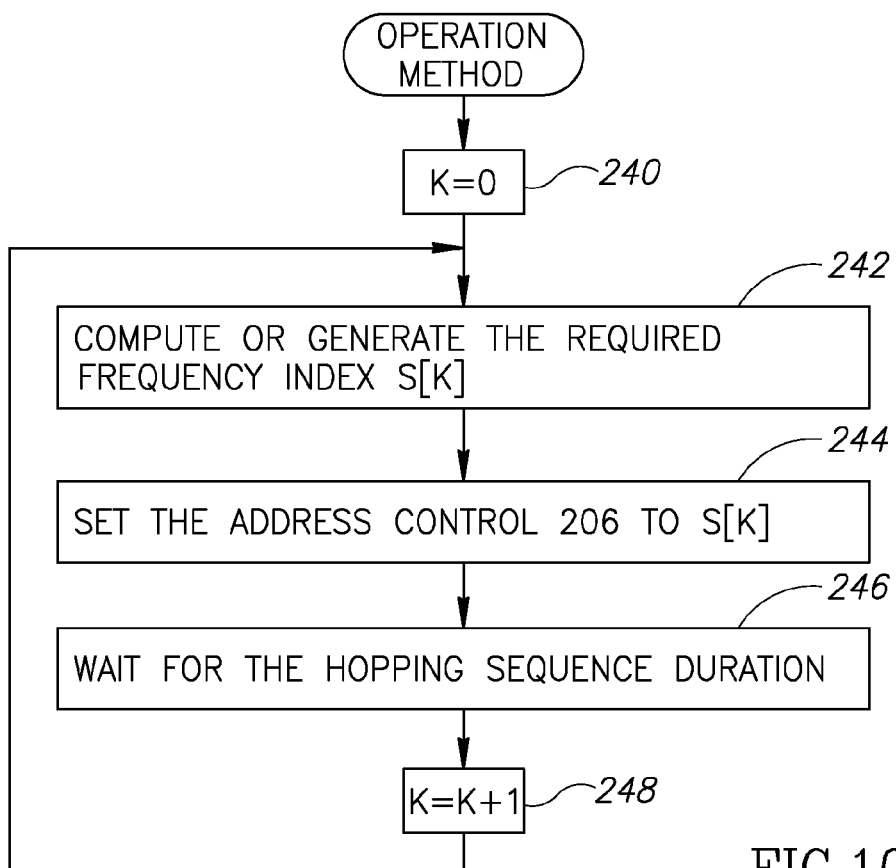
FIG. 10 is a flow diagram illustrating the operation mode sequence method of the first embodiment of the present invention.

A flow diagram illustrating the operation mode sequence method of the first embodiment of the present invention is shown in FIG. 10. The operation mode is entered after the initialization sequence has run. In this mode, the hopping logic executes an infinite loop (for as long as the circuit is on) using the sequence depicted in FIG. 10. The loop starts by setting a variable K to 0 (step 240). The loop then computes or generates the required frequency index S[K] (step 242). The required frequency index can be determined either by using a periodic table 'X' comprising M entries, where S[K]=$X_K$ mod M (cyclic sequence), or by using a computation circuit such as a maximal length shift register (MLSR) configured to create a pseudo noise (PN) sequence which generates the frequency indices. It is appreciated by one skilled in the art that other sequence patterns or sequence generation schemes are contemplated for use with the present invention.

Regardless of the technique used to generate the required frequency index, the cyclic sequence or generation mechanism is known a priori to both the transmitter and the receiver or negotiated between the two. For the WiMedia UWB standard referenced supra, the hopping sequence is cyclic using M=6. $X_K$ is therefore a length 6 table running a time frequency code (TFC) sequence (see Tables 7-2 through 7-6).

The operation sequence then sets the address control 206 of the OTW table to S[K] (step 244). The operation sequence then waits a uniform or variable pre-determined or generated hopping sequence duration (step 246) and then increments the variable K (step 248). The method repeats steps 242, 244, 246, 248 effectively creating an infinite loop (for as long as the circuit is active). In the case of the WiMedia UWB standard, the hopping duration is (170/528) μs.

The frequency synthesizer of the first embodiment of the present invention is thus operative to produce a clean fast hopping LO for modulation through the use of the ADPLL techniques referenced supra, while avoiding the disadvantages of the prior art, including the need for multiple PLLs and the generation of frequency spurs created in LO mixing. Note that the switching time of the open loop DCO used in the frequency synthesizer of the present invention has been shown to be extremely fast (i.e. within $1/f_T$, where $f_T$ is the transistor corner frequency), thus yielding an extremely fast hopping capability. Note also that frequency accuracy of this scheme is lower-bounded only by the DCO varactor resolution.

Note, however, that applying the well known technique of dithering, such as sigma-delta or other dithering, on the DCO varactors improves the DCO frequency resolution. Furthermore, the dithering could be applied either within the OFDM symbol or in between the OFDM symbols. Furthermore, one skilled in the art may use this synthesizer first embodiment in the context of (1) a transmitter, where the synthesizer is used to generate the upconversion LO; (2) a receiver, where the synthesizer is used to generate the downconversion LO or (3) a transceiver, where the synthesizer generates both the upconversion and downconversion LO signals.

Second Embodiment Direct Conversion Transmitter

Figure 11:
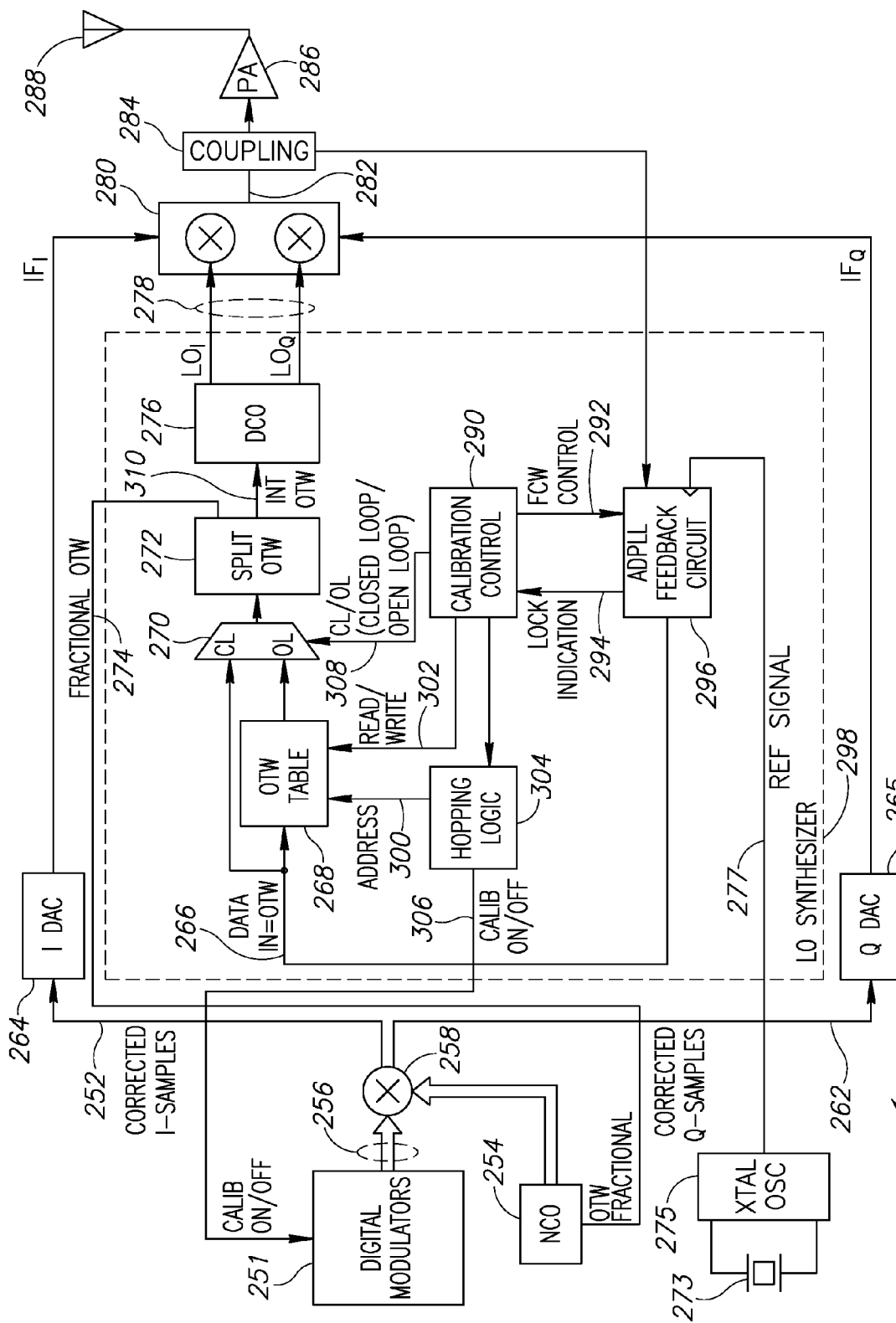
FIG. 11 is a block diagram illustrating a high-level direct conversion transmitter constructed in accordance with a second embodiment of the present invention.

A block diagram illustrating a high-level direct conversion transmitter constructed in accordance with a second embodiment of the present invention is shown in FIG. 11. This second embodiment is constructed and operates similarly to that of the first preferred embodiment shown in FIG. 7 with the main difference being the introduction in the second embodiment of a mechanism to improve frequency accuracy.

The transmitter circuit, generally referenced 250, comprises a crystal oscillator 275, coupled to a crystal 273, for generating a reference signal 277, digital modulator 251, numerically controlled oscillator (NCO) 254, I DAC 264, Q DAC 265, LO frequency synthesizer 298, I/Q mixer 280, coupling circuit 284, power amplifier (PA) 286 and antenna 288. The frequency synthesizer 298 comprises a Digitally Controlled Oscillator (DCO) 276 coupled through the feedback circuit portion 296 of an All Digital Phase Locked Loop (ADPLL) (the timing for which is provided by reference signal 277), a multiplexer 270 for opening the loop, an oscillator tuning word (OTW) table 268 (e.g., RAM or register file) for storing the pre-calibrated oscillator tuning words 266 of all required synthesized frequencies. A calibration control circuit 290 is operative to generate the signals for the rest of the modules for either calibrating the circuit or initializing the fast hopping sequence. The hopping logic 304 is operative to generate the required hopping sequence.

The OTW words stored in the OTW table 268 comprise an integer part, which corresponds to the minimum DCO varactor resolution, and a fractional part, which corresponds to an additional frequency correction that is used to improve the frequency accuracy. The split OTW block 272, functions to split the OTW words stored in the OTW table 268 into an integer part 310 and a fractional word part 274. The integer part 310 is fed to the DCO and corresponds to the minimum varactor resolution. The OTW fractional word 274 is fed back to the NCO which is operative to generate the frequency correction. Note that optionally, dithering, such as sigma delta dithering, can be applied to the DCO varactors. The dithering, if applied, is averaged over the number of symbols. Note that dithering can optionally be added to the frequency synthesizer of the first embodiment as well.

For further reference, this synthesizer generates a hopping sequence S[n] during the $n^{th}$ hopping duration, where S[n] is the index of the frequency to be transmitted from a finite frequency alphabet $\{F_i, i=0 \ldots N-1\}$ of size N. Therefore, the frequency synthesized during the $n^{th}$ hopping duration shall be $F_{S[n]}$. The synthesizer can thus generate N frequencies.

The digital modulator 251 is operative to generate in phase and quadrature samples 356. The digital mixer (i.e. complex multiplier) 258 applies the frequency offset correction generated by the NCO. The NCO functions to generate the frequency correction signal. The two digital to analog converters 264 and 265 convert the frequency corrected I and Q samples 252 and 262 respectively to analog waveforms. A quadrature (SSB) mixer 280 operates on the baseband analog voltages and the I and Q LO signals 278 generated by the DCO to generate an RF waveform 282 subsequently input to a power amplifier 286 and an antenna 288 via coupling circuit 284. The RF waveform signal 282 generated by the mixer is sampled using a coupling mechanism 284, such as a magnetic (or electromagnetic) coupler, and input to the ADPLL. The loop is thereby closed through mixer 280. The NCO 254 has the ability to generate a fine resolution complex exponential waveform ($\cos(2\pi ft)+j\sin(2\pi ft)$) which will effectively shift the synthesized frequency. Optimally, it is possible to remove the coupler 284 and drive the feedback signal from either output of the DCO by adjusting the FCW 292 to compensate for the ADPLL frequency multiplication of the NCO frequency change.

The synthesizer works in one of the following three modes: calibration, initialization and operation. Each mode is described in more detail infra with reference to FIGS. 12, 13 and 14.

Calibration

Figure 12:
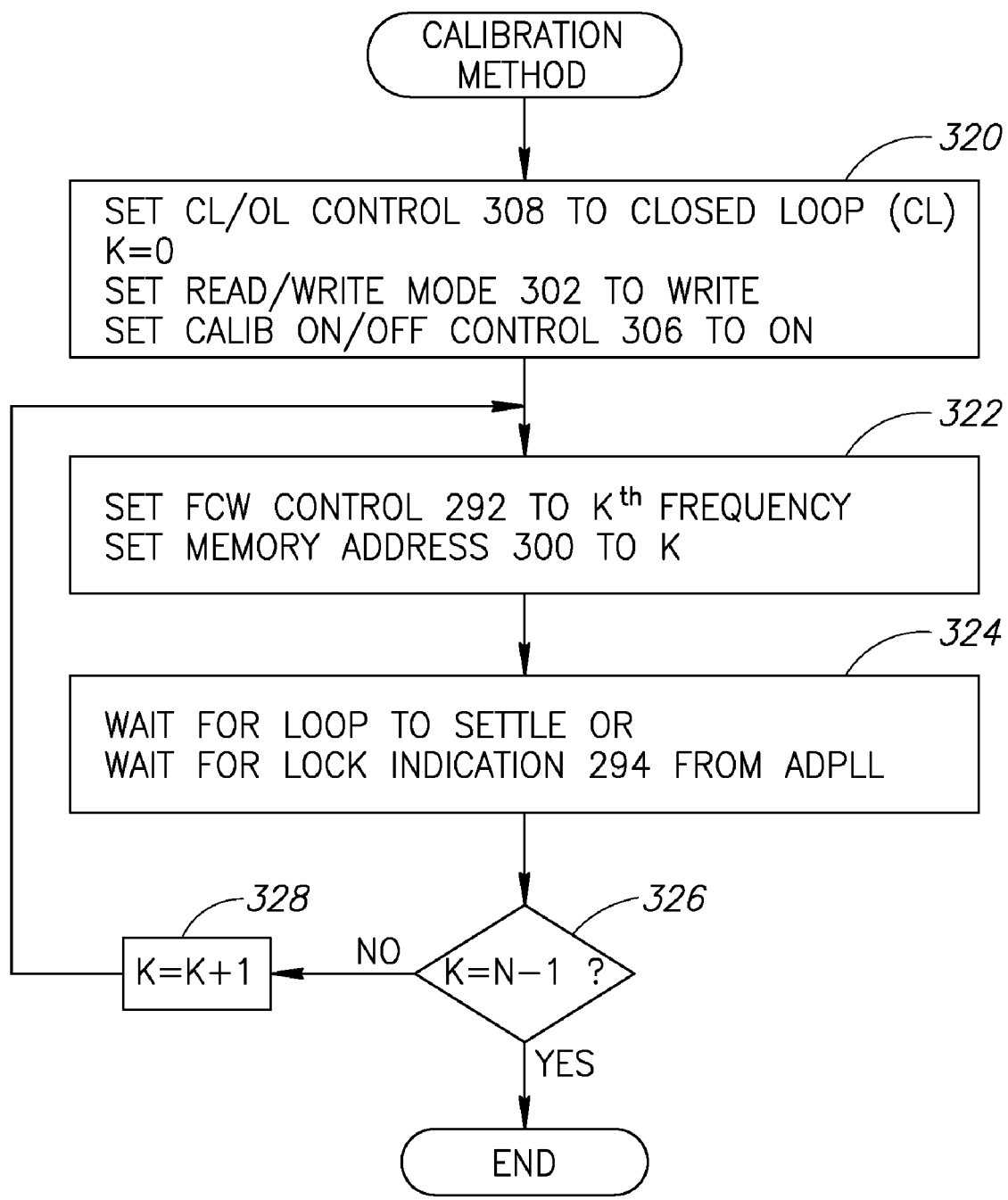
FIG. 12 is a flow diagram illustrating the calibration sequence method of the second embodiment of the present invention.

A flow diagram illustrating the calibration sequence method of the second embodiment of the present invention is shown in FIG. 12. The calibration method is performed periodically, or prior to a packet transmission. With reference to FIGS. 11 and 12, the calibration circuit 290 performs the calibration sequence method depicted in the figure. The calibration sequence starts by setting the multiplexer 270 to the closed loop mode by setting the CL/OL mux control 308 to CL, setting the variable K=0, setting the read/write control line to the OTW table 302 to "WRITE" and setting the digital modulator 306 calibration control line 306 to "ON" (step 320). The digital transmitter now outputs a DC value (such as full scale on I and 0 on Q). Next, (1) the FCW control (i.e. the frequency multiplication ratio) 292 of the ADPLL feedback circuit 296 is set such that the closed loop generates the $F_K$ frequency and (2) the memory address control 300 of the OTW table 268 is set to K (step 322).

The loop is now closed and the ADPLL will settle such that the DCO block 276 will generate I and Q LO signals 278 with frequency $F_K$ (to within a varactor resolution if DCO dithering is not used). The remaining frequency offset will be generated by the NCO 254. The calibration sequence now either waits a predetermined time or waits for a lock indication signal 294 from the ADPLL feedback circuit 296 indicating that the loop has settled to within a desired frequency error (step 324).

The calibration control 290 then checks whether it has any more frequencies to calibrate by determining whether variable K is equal to the number of desired frequencies N−1 (step 326). If there are no additional frequencies to calibrate, the calibration sequence ends. Otherwise, variable K is incremented (step 328) and the method continues with step 322. In this manner, the calibration control module 290 scans through all the desired frequencies $F_0$ through $F_{N-1}$, thus generating a table of the required OTWs in OTW table 268. Please note that in this second embodiment, the OTW table stored both OTW integer portions (at the varactor resolution) and fractional portions (at an arbitrary resolution which determines the overall frequency accuracy of the transmitter).

Initialization

Figure 13:
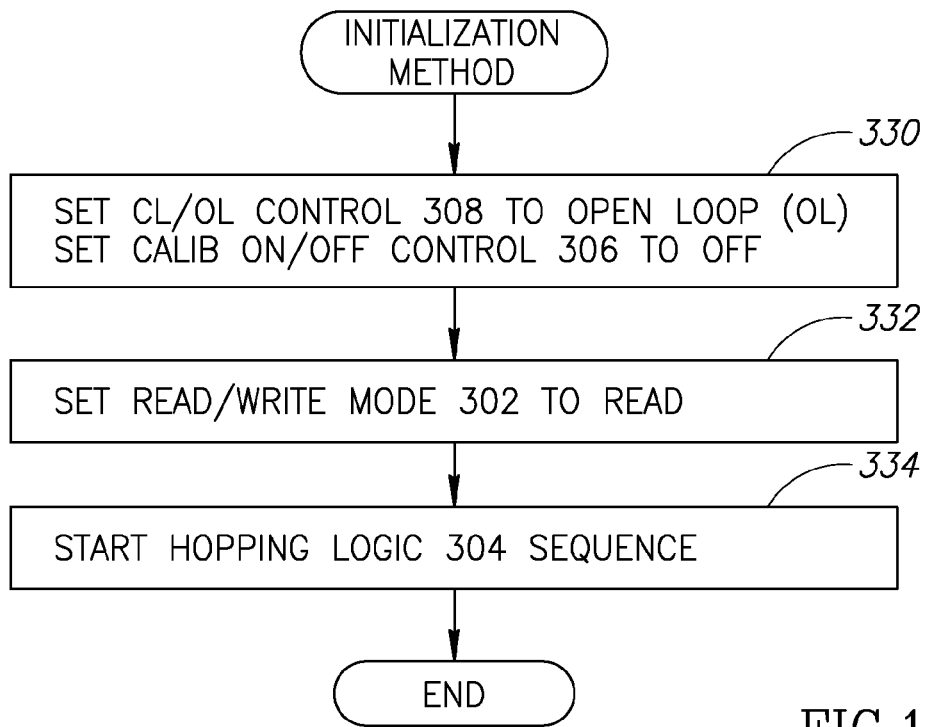
FIG. 13 is a flow diagram illustrating the initialization sequence method of the second embodiment of the present invention.

A flow diagram illustrating the initialization sequence method of the second embodiment of the present invention is shown in FIG. 13. In the initialization mode, an initialization sequence is performed by the calibration control block 290. The initialization sequence starts by (1) setting the CL/OL select line of the multiplexer 270 to OL thus opening the frequency synthesis loop and (2) setting the calibration on/off signal to the digital modulator 251 is set to "OFF", thus allowing the digital transmitter to generate the desired modulation scheme on I and Q samples 256 (step 330). The method then sets the read/write mode signal 302 of the OTW table 268 to "READ" (step 332). Finally, the method then starts generating the hopping sequence via the hopping logic 304 (step 334).

Operation

Figure 14:
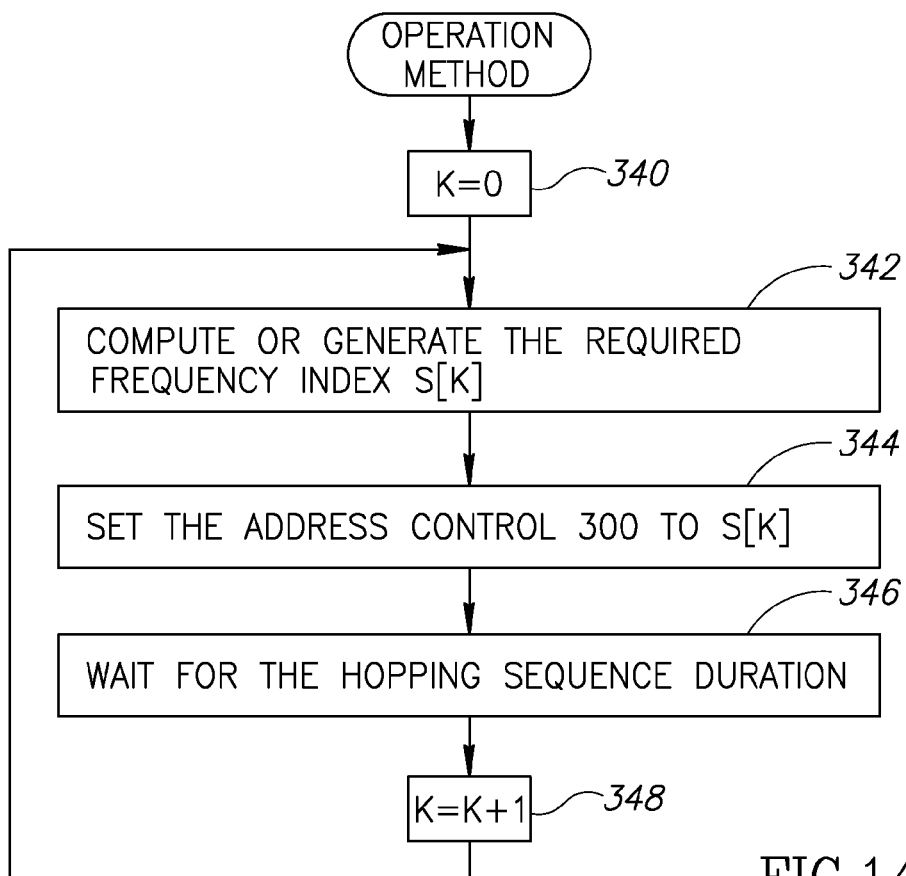
FIG. 14 is a flow diagram illustrating the operation mode sequence method of the second embodiment of the present invention.

A flow diagram illustrating the operation mode sequence method of the second embodiment of the present invention is shown in FIG. 14. In the operation mode, after the initialization sequence has run, the hopping logic 304 executes an infinite loop (for as long as the circuit is on) using the sequence illustrated in the figure. First, variable K is set to 0 (step 340). Then, the required frequency index S[K] is computed or generated (step 342). This operation is performed either using a periodic table 'X' comprising M entries, where $S[K]=X_K$ mod M (cyclic sequence) or using a computation circuit such as a maximal length shift register (MLSR) configured to create a pseudo noise (PN) sequence which generates the frequencies. It is appreciated by one skilled in the art that other sequence patterns or sequence generation schemes are contemplated for use with the present invention.

Regardless of the technique used to generate the required frequency index, the cyclic sequence or generation mechanism is known a priori to both the transmitter and the receiver, or negotiated beforehand between the two. For the WiMedia UWB standard referenced supra, the hopping sequence is cyclic using M=6. $X_1$ is therefore a length 6 table running a time frequency code (TFC) sequence (see Tables 7-2 through 7-6).

The operation sequence then sets the address control 300 of the OTW table to S[K] (step 344). The operation sequence then waits a pre-determined or generated hopping sequence duration (step 346) and then increments the variable K (step 348). The method repeats steps 342, 344, 346, 348 effectively creating an infinite loop (for as long as the circuit is active). In the case of the WiMedia UWB standard, the hopping duration is (170/528) μs.

The frequency synthesizer of the second embodiment of the present invention is thus operative to produce a clean fast hopping LO for modulation through the use of the ADPLL techniques referenced supra while retaining the advantages of the first embodiment (i.e. no need for multiple PLLs, avoidance of the frequency spurs generated during LO mixing, extremely fast hopping speed). Note, however, that the frequency resolution is now no longer limited to the DCO varactor resolution but can be any arbitrary frequency depending on the bus width of the fractional portion of the OTW and on the resolution and size of the table within the NCO 254.

Third Embodiment Direct Conversion Receiver

Figure 15:
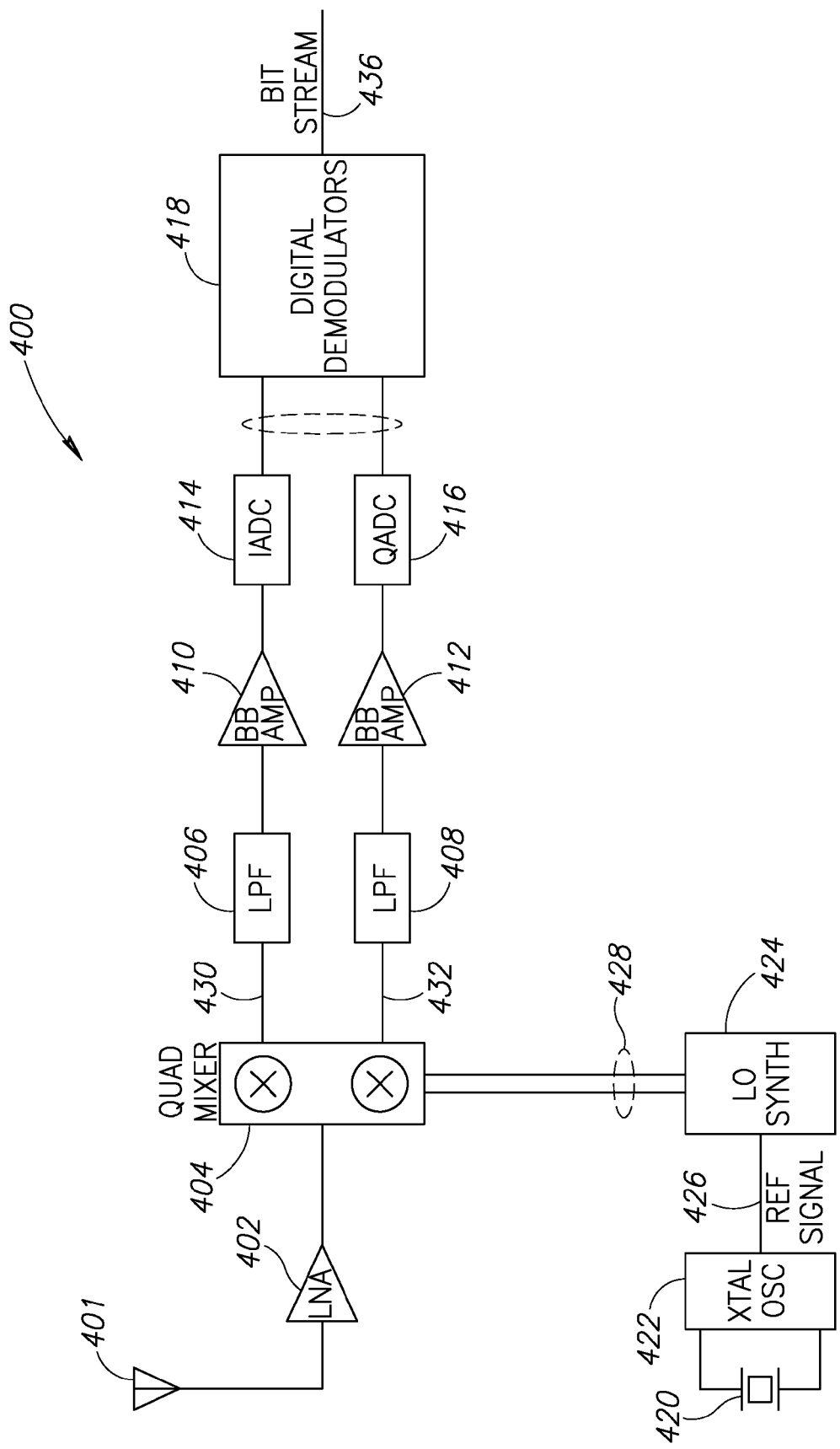
FIG. 15 is a block diagram illustrating a high-level direct conversion receiver constructed in accordance with a third embodiment of the present invention.

A block diagram illustrating a high-level direct conversion receiver constructed in accordance with a third embodiment of the present invention is shown in FIG. 15. The receiver, generally referenced 400, comprises an antenna 401, low noise amplifier 402, quadrature mixer 404, low pass filters (LPFs) 406, 408, baseband amplifiers 410, 412, analog to digital converters (ADCs) 414, 416, digital demodulator 418, crystal 420, crystal oscillator 422 and LO synthesizer 424.

In operation, the signal from the antenna is amplified by the LNA. The quadrature mixer functions to mix the amplified signal with the in phase (I) and quadrature (Q) LO signal pair 428. The resultant I baseband signal 430 and Q baseband signal 432 undergo anti-aliasing baseband filtering using analog low pass filters 406 and 408, respectively. The filter outputs undergo amplification in the baseband via amplifiers 410 and 412 and are subsequently sampled using analog to digital converters 414 and 416. The complex sample stream 434 is input to a digital demodulator, which is operative to demodulate the signal and output the demodulated and decoded bit stream 436.

The crystal oscillator 422, coupled to a crystal 420 outputs the reference signal 426, which is input to the LO synthesizer 424 in accordance with the present invention. The LO synthesizer is constructed similarly to that of the frequency synthesizer 182 of the first embodiment transmitter (FIG. 7). Utilizing the LO synthesizer of the present invention, the receiver 400 exhibits fast hopping using a DCO and ADPLL and utilizes the same calibration, initialization and operation procedures as the first embodiment (FIGS. 8, 9 and 10). It is appreciated by one skilled in the art that a fast hopping transceiver capable of either transmitting or receiving a fast hopping signal can be constructed by combining the first and third preferred embodiments and sharing the LO synthesizer between the transmitter and receiver.

Fourth Embodiment Time Division Duplex (TDD) Direct Conversion Transceiver

Figure 16:
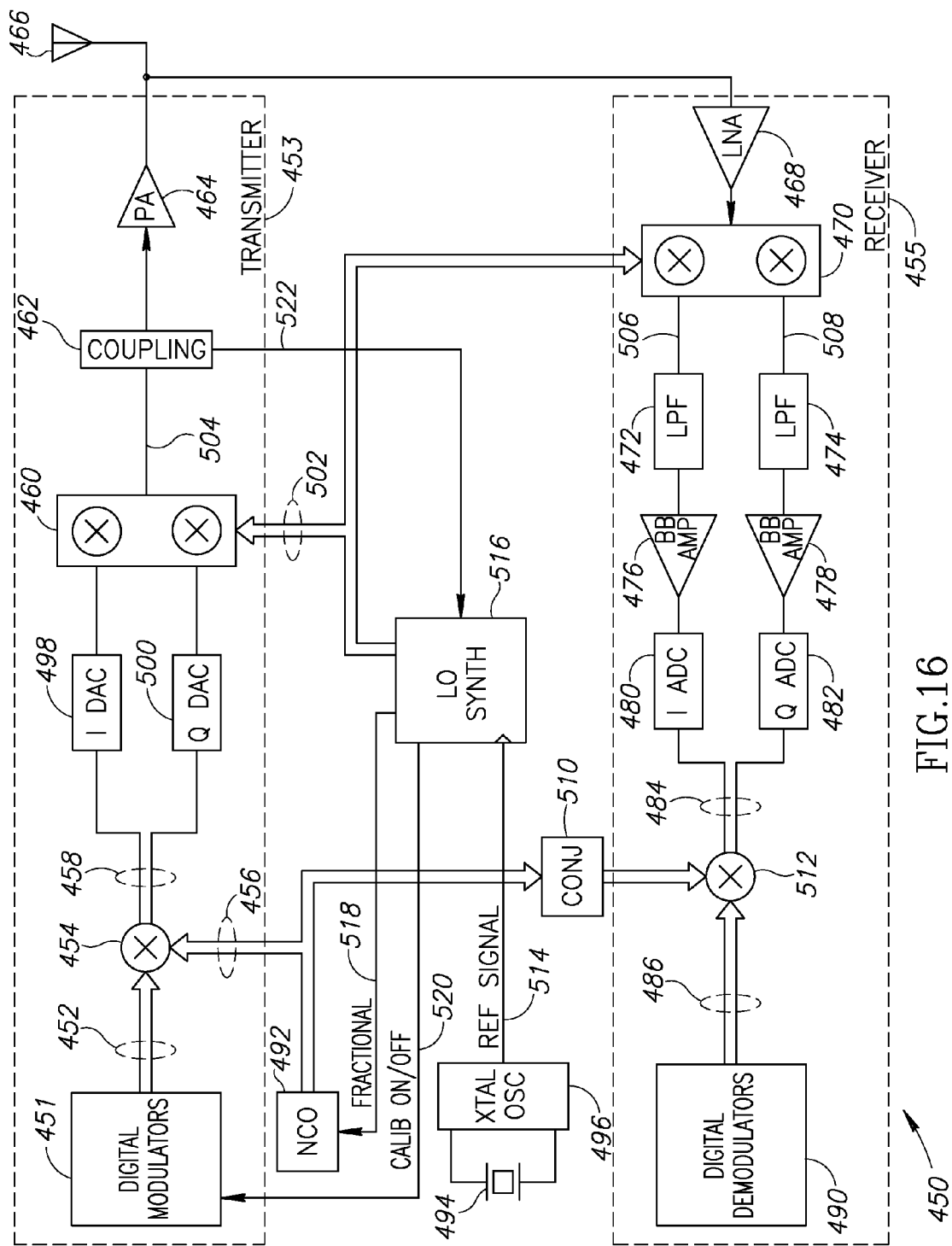
FIG. 16 is a block diagram illustrating a high-level direct conversion transceiver constructed in accordance with a fourth embodiment of the present invention.

A block diagram illustrating a high-level direct conversion transceiver constructed in accordance with a fourth embodiment of the present invention is shown in FIG. 16. The transceiver, generally referenced 450, comprises a transmitter circuit 453 and receiver circuit 455. The transceiver also comprises shared components including crystal 494, crystal oscillator 496, NCO 492, LO synthesizer 516 and complex conjugation using block 510.

The transmitter 453 comprises one or more digital modulators 451, which output a complex sample stream pair 452 which undergoes complex multiplication, via multiplier 454, with a complex exponential frequency correction sample stream 456 generated by NCO 492. The complex frequency corrected sample stream 458 undergoes digital to analog conversion using DACs 498 and 500 for the I and Q samples, respectively. The analog signals are then mixed (i.e. upconverted) with the LO I and LO Q signal pair 502 to generate an RF signal 504. A coupling circuit 462 functions to feed a portion of the RF signal 504 to the LO synthesizer for calibration purposes. The signal is then amplified via power amplifier (PA) 464 and input to RF antenna 466 for wireless transmission.

The receiver 455 shares the same antenna 466 (or can optionally use a separate antenna) to pick up over the air wireless signals. The LNA 468 applies low noise amplification to the received signal. The output of the LNA undergoes quadrature downconversion using quad mixer 470 and the output of the LO synthesizer 516. The baseband I and Q signals 506 and 508 output of the quadrature mixer 470 undergo low pass anti-aliasing filtering using low pass filters 472 and 474, respectively. The I and Q outputs are amplified in the baseband using amplifiers 476 and 478 and then sampled via ADCs 480 and 482, respectively. The sampled uncorrected baseband complex sample stream 484 is multiplied by the output of the NCO 492 (after complex conjugation via block 510) using complex multiplier 512. The resultant complex sample stream 486 is then input to a digital demodulator 490.

A crystal oscillator 496, coupled to a crystal 494 generates a reference signal 514. This signal is input to the LO synthesizer 516. The latter is identical to the LO synthesizer of the second preferred embodiment (FIG. 11, block 298). It generates the LO I and Q pair 502, input to transmitter mixer 460 and receiver mixer 470, based on the reference signal 514. The LO synthesizer also outputs a calibration indication 520 to the digital modulator, which makes the modulator output a DC signal, as well as a fractional frequency word 518 to NCO 492. The synthesizer uses an RF signal 522 tapped from the transmitted signal, in order to lock the ADPLL closed loop.

The calibration, initialization and operation methods performed by the transceiver 450 are similar to those performed by the transmitter of the second embodiment (FIGS. 12, 13 and 14). When in the transmit mode, the PA 464 is enabled, while the LNA 468 is disabled. When in the receive mode, the PA 464 is disabled and the LNA 468 is enabled. In both modes, the LO synthesizer 516 and NCO 492 are operational.

Optimally, it is possible to remove the coupler 462 and drive the feedback signal from either output of the DCO by adjusting the FCW (within LO synthesizer 516) to compensate for the ADPLL frequency multiplication of the NCO 492 frequency change.

This fourth embodiment provides a complete fully functional fast hopping TDD transceiver. In accordance with the invention, for purposes of LO generation, only one DCO and one PLL circuit is required. Furthermore, the transmitter circuit is used for calibration of the LO synthesizer 516 wherein the same calibration settings are used for both receive and transmit operation. Note that the NCO 492 is operative to output a complex exponential tone for (1) modulating the transmitted signal thus improving the frequency accuracy of the transmitter and (2) demodulating the incoming received sample stream thus improving the received frequency accuracy. It is appreciated by one skilled in the art that many digital demodulator schemes incorporate an NCO and complex multiplier as part of the frequency correction loop (used to track crystal frequency differences), in which case the demodulator estimates, tracks and compensates for the DCO varactor granularity together with frequency offset due to transmitter-receiver reference frequency differences. If the digital demodulator 490 comprises such a capability, blocks 512 and 510 are not needed, while signals 484 and 486 should be shortened.

Note that all four embodiments presented supra rely on the calibration routine to ensure the frequency accuracy during the normal operation of symbol transmission. The normal operation of symbol transmission is executed in an open-loop manner in which the ADPLL does not provide for any corrections to the DCO frequency drift. The calibration can be executed frequently enough to account for the slow DCO center frequency drift. The periodical calibration, however, is preferably performed off-line as it typically requires dedicated time slots and thus can interfere with the normal transmitter operation.

A technique is provided by the invention that provides for the LO operation that does not require frequent periodical calibration but still operates the DCO in the open loop manner during the symbol and ZPS duration (242+80=322 ns). It is recognized that the 322 ns interval is too short for any substantial closed-loop correction due to the low number of reference frequency clock cycles within the ADPLL. Thus, a hybrid of open-loop/closed-loop operation is required in which the operation within the OFDM symbol or ultra short packet is open-loop but the operation is closed-loop at the inter-packet level. During the symbol and ZPS duration, the ADPLL phase domain circuitry compares the DCO output with the frequency reference and calculates the phase and frequency departures (i.e. errors). These departures are too noisy to be used by themselves and instead they are combined with similar information from previous symbols. Hence, these calculated departures do not correct the DCO tuning word in real-time nor immediately and in their entirety after the symbol duration is finished but rather are provided to an inter-symbol ADPLL controller within the ADPLL feedback circuit. The controller combines this information with that from previous symbols to adjust the DCO OTW table. It is noted that the calculated frequency, calculated phase and the equivalent phase shift due to the frequency hop need to be used as well in determining the adjustments to be applied to the OTW table.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A frequency synthesizer, comprising:
   a table adapted to store a plurality of oscillator tuning words (OTW);
   means for splitting said OTW into an integer portion and a fractional portion;
   an all digital phase locked loop (ADPLL), comprising:
      a digitally controlled oscillator (DCO) coupled to said table, said DCO operative to generate local oscillator (LO) signals whose frequency is determined in accordance with said integer portion of said OTW outputted from said table;
      a feedback circuit coupled to the output of said DCO, said feedback circuit operative to calibrate the frequency output of said DCO; and
   calibration means having an output coupled to an input of said table, having another output coupled to an input of said feedback circuit, and having an input coupled to an output of said feedback circuit, said calibration means operative to configure open and closed modes of operation of said frequency synthesizer.

2. The frequency synthesizer according to claim 1, further comprising hopping logic coupled to table, said hopping logic operative to generate a frequency hopping control sequence input to said table.

3. The frequency synthesizer according to claim 1, wherein said integer portion of said OTW corresponds to a minimum DCO resolution.

4. The frequency synthesizer according to claim 1, wherein, fractional portion corresponds to a frequency correction used to improve the frequency accuracy of said frequency synthesizer.

5. The frequency synthesizer according to claim 1, wherein said feedback circuit is operative to generate a lock indication signal as an input to said calibration means.

6. The frequency synthesizer according to claim 1, wherein said calibration means is operative to generate a FCW signal for controlling the operation of said feedback circuit.

7. The frequency synthesizer according to claim 1, wherein said calibration means comprises a multiplexer having a closed loop mode of operation whereby OTW data output of said feedback circuit bypasses said table and is input to said DCO.

8. The frequency synthesizer according to claim 1, wherein said calibration means comprises a multiplexer having an open loop mode of operation whereby OTW data output of said table is input to said DCO.

9. The frequency synthesizer according to claim 1, wherein said calibration means is operative to periodically perform calibration in a closed loop mode of operation and to adjust for any shifts in DCO center frequency.

10. The frequency synthesizer according to claim 1, wherein said calibration means comprises means for comparing DCO output with a frequency reference and calculating a plurality of phase and frequency departures which are combined over a plurality of symbols to determine adjustments to be applied to said OTW table.

11. The frequency synthesizer according to claim 1, wherein said LO signals comprise in phase (I) and quadrature (Q) signals.

12. A frequency hopping transmitter, comprising:
a digital modulator operative to generate I and Q data samples;
a fast hopping frequency synthesizer, comprising:
a table adapted to store a plurality of oscillator tuning words (OTW);
means for splitting said OTW into an integer portion and a fractional portion;
an all digital phase locked loop (ADPLL), comprising:
a digitally controlled oscillator (DCO) coupled to said table, said DCO operative to generate in phase and quadrature local oscillator (LO) signals whose frequency is determined in accordance with said integer portion of said OTW outputted from said table;
a feedback circuit coupled to the output of said DCO, said feedback circuit operative to calibrate the frequency output of said DCO;
hopping means operative to generate a frequency hopping control sequence input to said table;
calibration means having an output coupled to an input of said table, having another output coupled to an input of said feedback circuit, and having an input coupled to an output of said feedback circuit, said calibration means operative to configure open and closed modes of operation of said frequency synthesizer;
frequency correction means for generating and applying a frequency correction signal to said I samples and said Q samples in accordance with said fractional portion of said OTW;
a mixer operative to mix frequency corrected I data samples with said in phase LO signal and to mix frequency corrected Q data samples with said quadrature LO signal to generate an RF waveform signal therefrom; and
a power amplifier coupled to said mixer, said power amplifier operative to amplify said RF waveform signal to yield an output RF signal therefrom.

13. The transmitter according to claim 12, wherein said frequency correction signal comprises a fine resolution complex exponential waveform adapted to effectively shift the synthesized frequency.

14. The transmitter according to claim 12, wherein said frequency correction means comprises:
a numerically controlled oscillator (NCO) operative to generate said frequency correction signal in accordance with the fractional portion of said OTW; and
a complex multiplier operative to mix the output of said digital modulator with the output of said NCO resulting in said frequency corrected I samples and said frequency corrected Q samples.

15. The transmitter according to claim 12, wherein, fractional portion corresponds to a frequency correction used to improve the frequency accuracy of said frequency synthesizer.

16. The transmitter according to claim 12, wherein said feedback circuit is operative to generate a lock indication signal.

17. The transmitter according to claim 12, wherein said calibration means is operative to generate a frequency command word (FCW) signal for controlling the operation of said feedback circuit.

18. The transmitter according to claim 12, wherein said calibration means comprises a multiplexer having a closed loop mode of operation whereby OTW data output of said feedback circuit bypasses said table and is input to said DCO.

19. The transmitter according to claim 12, wherein said calibration means comprises a multiplexer having an open loop mode of operation whereby OTW data output of said table is input to said DCO.

20. The transmitter according to claim 12, wherein said calibration means comprises means for comparing DCO output with a frequency reference and calculating a plurality of phase and frequency departures which are combined over a plurality of symbols to determine adjustments to be applied to said OTW table.

21. The transmitter according to claim 12, wherein said calibration means is operative to periodically perform calibration in a closed loop mode of operation and to adjust for any shifts in DCO center frequency.

22. The transmitter according to claim 12, wherein said calibration means comprises means for comparing DCO output with a frequency reference and calculating a plurality of phase and frequency departures which are combined over a plurality of symbols to determine adjustments to be applied to said OTW table.

23. The transmitter according to claim 12, wherein said hopping means is operative to generate a cyclic hopping sequence.

24. The transmitter according to claim 12, wherein said hopping means is operative to generate a hopping sequence in accordance with the WiMedia Ultra-Wideband (UWB) standard.

25. The transmitter according to claim 12, wherein said hopping means is operative to generate a predetermined sequence.

26. The transmitter according to claim 12, wherein said hopping means is operative to generate a sequence negotiated a priori.

27. The transmitter according to claim 12, wherein said hopping means is operative to generate a sequence based on a Maximal Length Shift Register (MLSR).

28. The transmitter according to claim 12, wherein said data samples comprise an orthogonal frequency division multiplexing (OFDM) modulated signal.

29. The transmitter according to claim 12, wherein said data samples comprise a Quadrature Amplitude Modulation (QAM) modulated signal.

30. The transmitter according to claim 12, wherein said data samples comprise a Frequency Shift Keying (FSK) modulated signal.

31. The transmitter according to claim 12, wherein said output RF signal comprises an ultra-wideband (UWB) signal.

32. A frequency hopping receiver, comprising:
a low noise amplifier (LNA) coupled to an antenna, said LNA adapted to generate an amplified receive signal;
a fast hopping frequency synthesizer, comprising:
a table adapted to store a plurality of oscillator tuning words (OTW);
an all digital phase locked loop (ADPLL), comprising:
a digitally controlled oscillator (DCO) coupled to said table, said DCO operative to generate local oscillator (LO) signals whose frequency is determined in accordance with said OTW outputted from said table;

a feedback circuit coupled to the output of said DCO, said feedback circuit operative to calibrate the frequency output of said DCO;

hopping means operative to generate a frequency hopping control sequence input to said table;

calibration means having an output coupled to an input of said table, having another output coupled to an input of said feedback circuit, and having an input coupled to an output of said feedback circuit, said calibration means operative to configure open and closed modes of operation of said frequency synthesizer;

a quadrature mixer operative to mix said receive signal with said local oscillator signals to yield analog baseband signals therefrom;

analog to digital converter means operative to convert said analog baseband signals to a baseband sample stream; and a digital demodulator operative to generate receive data from said baseband sample stream.

* * * * *